(12) United States Patent
Kuroki et al.

(10) Patent No.: US 7,289,008 B2
(45) Date of Patent: Oct. 30, 2007

(54) HIGH-FREQUENCY MODULE AND COMMUNICATION APPARATUS

(75) Inventors: Hiroshi Kuroki, Kokubu (JP); Hiroyuki Mori, Kokubu (JP); Kenji Kitazawa, Kokubu (JP); Yoshihiro Miyawaki, Kokubu (JP)

(73) Assignee: Kyocera Corporation, Kyoto (JP)

( * ) Notice: Subject to any disclaimer, the term of this patent is extended or adjusted under 35 U.S.C. 154(b) by 96 days.

(21) Appl. No.: 10/962,170

(22) Filed: Oct. 7, 2004

(65) Prior Publication Data

US 2005/0104685 A1 May 19, 2005

(30) Foreign Application Priority Data

| Oct. 8, 2003 | (JP) | 2003-349912 |
|---|---|---|
| Oct. 16, 2003 | (JP) | 2003-356948 |
| Oct. 27, 2003 | (JP) | 2003-366258 |
| Oct. 31, 2003 | (JP) | 2003-373161 |

(51) Int. Cl.
*H03H 9/72* (2006.01)
*H03H 9/64* (2006.01)
*H03H 3/10* (2006.01)

(52) U.S. Cl. ..................... 333/133; 333/193
(58) Field of Classification Search ............... 333/193, 333/133; 310/313 R
See application file for complete search history.

(56) References Cited

U.S. PATENT DOCUMENTS

| 5,459,368 A * | 10/1995 | Onishi et al. ............ 310/313 R |
|---|---|---|
| 6,246,148 B1 * | 6/2001 | Flowers et al. ......... 310/313 B |
| 6,424,233 B1 * | 7/2002 | Tonegawa et al. .......... 333/133 |
| 6,456,172 B1 * | 9/2002 | Ishizaki et al. ............. 333/133 |
| 6,750,737 B2 * | 6/2004 | Uriu et al. .................. 333/133 |
| 6,784,765 B2 * | 8/2004 | Yamada et al. ............. 333/193 |
| 6,873,529 B2 * | 3/2005 | Ikuta et al. ................. 361/719 |
| 6,879,488 B2 * | 4/2005 | Takeda et al. .............. 361/704 |
| 6,980,066 B2 * | 12/2005 | Nakai et al. ................ 333/128 |
| 6,998,912 B2 * | 2/2006 | Kushitani et al. ............. 330/51 |
| 2005/0003855 A1 * | 1/2005 | Wada et al. ............. 455/552.1 |

FOREIGN PATENT DOCUMENTS

| JP | 04-293310 | 10/1992 |
|---|---|---|
| JP | 11-017495 | 1/1999 |
| JP | 2001-011286 | 1/2001 |
| JP | 2001-044224 | 2/2001 |
| JP | 2002-076832 | 3/2002 |
| JP | 2002-118487 | 4/2002 |
| JP | 2002-171137 | 6/2002 |
| JP | 2002-196400 | 7/2002 |
| JP | 2002-261643 | * 9/2002 |
| JP | 2003-008769 | 1/2003 |
| JP | 2003-012888 | 1/2003 |
| JP | 2003-168942 | 6/2003 |
| WO | WO 02/080634 | * 10/2002 |
| WO | WO 03/026155 | * 3/2003 |

* cited by examiner

*Primary Examiner*—Barbara Summons
(74) *Attorney, Agent, or Firm*—Hogan & Hartson LLP

(57) ABSTRACT

A high-frequency module has a structure wherein transmitting filters, receiving filters and high-frequency power amplifiers are mounted on a multilayered substrate and wherein matching circuits are inserted between input terminals of the receiving filters and output terminals of the transmitting filters. Transmission lines as components of the matching circuits, and the like are formed internally of the multilayered substrate. Thus, the whole body of the high-frequency module can be downsized.

32 Claims, 26 Drawing Sheets

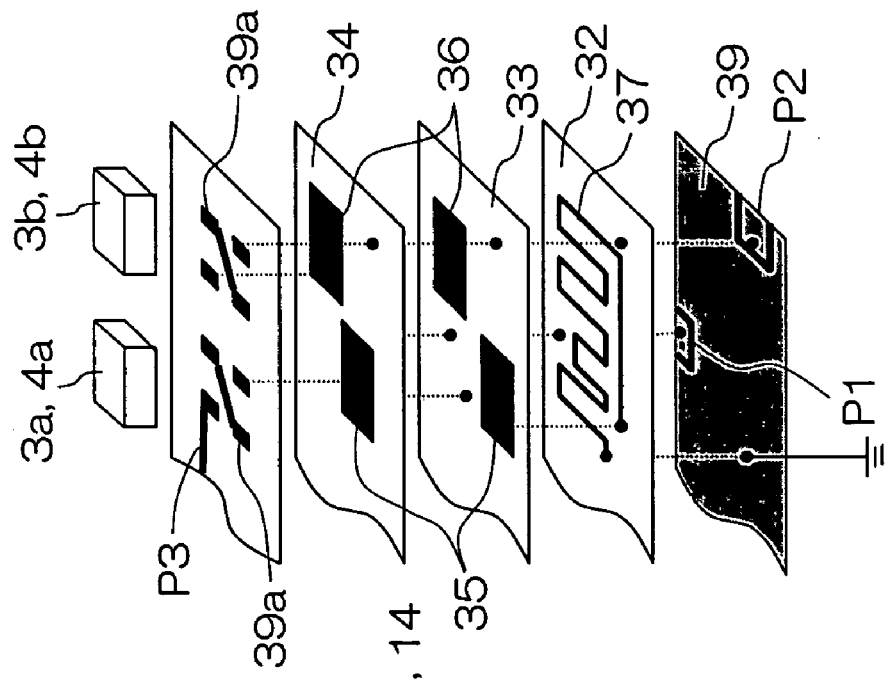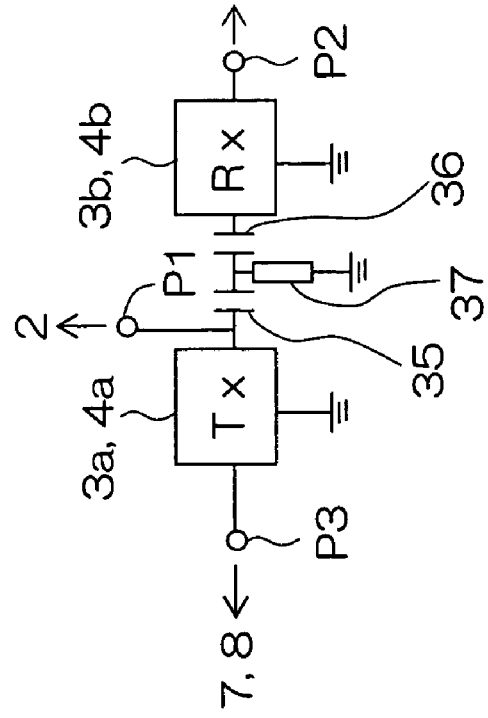

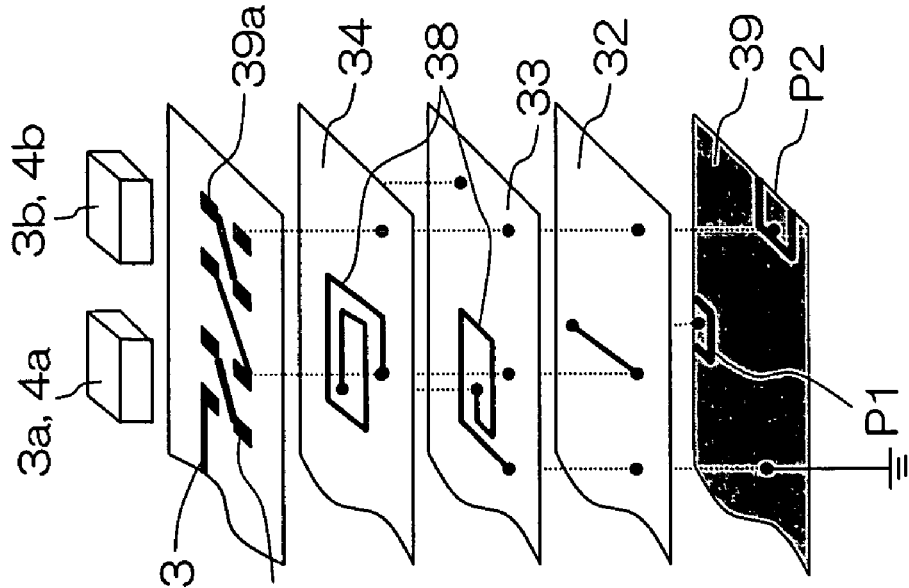
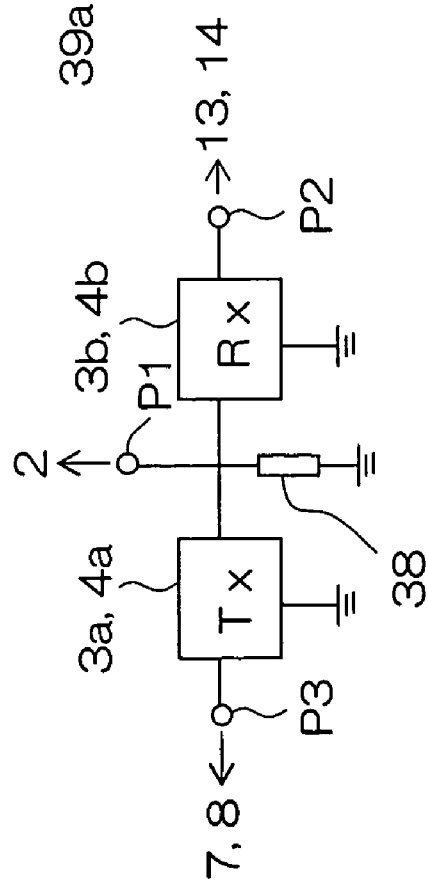

HIGH-FREQUENCY MODULE AND COMMUNICATION APPARATUS

BACKGROUND OF THE INVENTION

1. Field of the Invention

The present invention relates to a high-frequency module integrating a high-frequency power amplifier circuit, a band pass filter, a high-frequency multiplexer circuit and the like, as well as to a communication apparatus, such as a mobile phone, which incorporates therein the high-frequency module.

2. Description of the Related Art

The mobile phones have been spreading wider in recent years, while improvements have been made in the function of the mobile phones and the services associated therewith.

In such a mobile phone, high-frequency signal processor circuits necessary for the construction of each transmission/reception system are mounted on a substrate.

In a general configuration of the conventional high-frequency signal processor circuit, a transmitting filter and a receiving filter are provided for switching between a reception signal inputted from an antenna and a transmission signal supplied to the antenna.

A radio signal inputted via the antenna is inputted to the receiving filter via a matching circuit provided at a fore stage of the receiving filter, the receiving filter selectively allowing the passage of the reception signal. The reception signal is amplified by a low noise amplifier before supplied to the signal processor circuit.

On the other hand, the transmission signal passes through the band pass filter thereby eliminating noises therefrom, the band pass filter allowing the passage of transmission signals in a predetermined transmission passband. The resultant signal is sent to the high-frequency power amplifier circuit. The high-frequency power amplifier circuit power amplifies the transmission signal before supplying the signal to the transmitting filter.

It has been a conventional practice to manufacture the transmitting and receiving filters, matching circuit, high-frequency power amplifier circuit, band pass filter and such as discrete components which are discretely mounted on an upper side of the substrate.

Unfortunately, if the individual special components are discretely mounted on the substrate, the apparatus is increased in size and costs.

Hence, there arises a demand for downsizing the whole body of the high-frequency module by miniaturizing/integrating as many miniaturizable circuit portions as possible.

It is therefore an object of the invention to provide a high-frequency module which can achieve the downsizing of the whole body thereof by forming a transmission line, an inductor and a capacitor, as components of the matching circuit, at an internal layer of a multilayered substrate, and to provide a communication apparatus incorporating the same.

BRIEF SUMMARY OF THE INVENTION

A high-frequency module according to the invention comprises: a transmitting filter and a receiving filter connected with an antenna terminal directly or via a multiplexer circuit, and operative to switch between a transmission system and a reception system; a matching circuit inserted in an input side of the receiving filter; and a high-frequency power amplifier circuit connected with the transmitting filter for amplifying a transmission signal in a predetermined transmission pass band, the filters, matching circuit and high-frequency power amplifier circuit provided on a multilayered substrate, and is characterized in that a passive device constituting a part of the matching circuit is formed at a dielectric layer within the multilayered substrate.

According to the above structure, the matching circuit is inserted between the antenna terminal or an output terminal of the multiplexer circuit and an input terminal of the receiving filter thereby optimizing a signal phase or accomplishing impedance matching. In this structure, the passive device constituting a part of the matching circuit is formed at the dielectric layer within the multilayered substrate. Thus, the multilayered substrate is provided with a surface area to mount the transmitting filter and receiving filter and the high-frequency power amplifier circuit, so that the whole body of the high-frequency module can be downsized.

The matching circuit is inserted between the input terminal of the receiving filter and the output terminal of the transmitting filter.

The matching circuit normally includes a transmission line formed at the dielectric layer within the multilayered substrate.

Furthermore, the matching circuit may further include an inductor device and/or a capacitor device formed at the dielectric layer within the multilayered substrate, may further include a chip component of the inductor device and/or the capacitor device, the chip component disposed on the surface of the multilayered substrate.

The transmitting filter and/or the receiving filter may preferably comprise a SAW filter.

If the SAW filter comprises a bare chip, the SAW filter may be flip-chip provided on the surface of the multilayered substrate by way of bumps, in contrast to a high-frequency module constituted by packaged components. This results in a reduced number of mounting steps, while a compact high-frequency module as a whole may be provided.

A specific mode of the flip-chip mounting is as follows. A main surface of the bare chip is formed with IDT electrodes, input/output electrodes of the IDT electrodes, and a ground electrode surrounding the IDT electrodes. The ground electrode and the input/output electrodes are bonded with electrodes formed on the surface of the multilayered substrate in a face-to-face relation, and a sealed space is formed at a SAW propagation portion of the IDT electrodes. Such a structure can maintain the SAW propagation portion of the SAW filter in a sealed state.

If the multilayered substrate is formed with a cavity, in which the bare chip of the SAW filter is flip-chip mounted, a smaller mounting surface is needed because plural bare chips may be mounted as vertically arranged. Hence, the high-frequency module may be further downsized. A further size reduction of the high-frequency module may also be accomplished by mounting the bare chip to a back side of the multilayered substrate.

The transmitting SAW filter and the receiving SAW filter may be formed on a single piezoelectric substrate so as to constitute a single bare chip. Furthermore, the bare chip may be provided on a surface of a substrate (refer to "54" in FIG. 14) to form a SAW package.

According to the above structure, the SAW package itself may be made thinner by forming the matching circuit in the multilayered substrate, the matching circuit conventionally incorporated in the SAW package. Hence, the high-frequency module as a whole may be reduced in height. In addition, variations of the filter characteristics of the two filters may be reduced by forming the transmitting filter and the receiving filter on the same piezoelectric substrate.

Where the transmitting SAW filter and the receiving SAW filter are formed on the same piezoelectric substrate, the Tx filter and the Rx filter may suffer an inferior isolation characteristic therebetween although the Tx filter and the Rx filter formed on the same piezoelectric substrate afford a merit in terms of the size reduction. On the other hand, a high power is supplied to the Tx filter from the high-frequency power amplifier circuit, so that the Tx filter itself generates heat. The heat is directly transferred to the Rx filter, as well, and hence, the increased temperature thereof may sometimes change the frequency characteristic of the Rx filter.

Therefore, the transmitting SAW filter may constitute one bare chip formed on a piezoelectric substrate, whereas the receiving SAW filter may constitute one bare chip formed on another piezoelectric substrate.

Then, the bare chip including the transmitting SAW filter may be provided on the substrate thereby forming a transmission SAW package, whereas the bare chip including the receiving SAW filter may be provided on the substrate thereby forming a reception SAW package.

By dividing the SAW filter into the Tx filter and the Rx filter, the isolation characteristic therebetween may be improved. Since the heat generated from the Tx filter is less transferred to the Rx filter, the Rx filter can attain more reliable filter characteristics.

In another aspect of the invention, a high-frequency module has a structure wherein the ground electrode and the input/output electrodes formed on the main surface of the bare chip constituting the SAW filter are bonded with the electrodes formed on the surface of the multilayered substrate in a face-to-face relation, and wherein the components provided on the multilayered substrate are sealed with a mold resin in a state where the sealed space is formed at the SAW propagation portion of the IDT electrodes.

According to the high-frequency module of the invention, the SAW filter chip is sealed with the mold resin having a predetermined property when face-down bonded to the multilayered substrate. In a case where the high-frequency module is secondarily provided on a mother board or where another electronic component is solder mounted after the mounting of the SAW filter chip, the mold resin exhibits a low rigidity under a temperature condition during the solder mounting, so that a pressure of the molten/expanded solder at joints of the input/output electrodes and of the ground electrode, which is re-molten, is allowed to dissipate not only toward the sealed space but also toward the mold resin. This prevents the solder from flowing into the sealed space, so that the resin may be enhanced in the hermetic sealing performance. Furthermore, the occurrence of shorts or breaks can be avoided.

The mold resin may preferably be a thermosetting resin having properties which include: a elastic modulus of 4 to 8 GPa at room temperatures, a elastic modulus of 0.2 to 0.5 GPa at 220° C., and a glass transition point of 100 to 150° C.

It is also preferred that the module substrate has a linear expansion coefficient of 8 to 18×10$^{-6}$/° C. at 25 to 400° C. It is further preferred that the linear expansion coefficient of the thermosetting resin at temperatures lower than the glass transition point is in the range of 25 to 80×10$^{-6}$/° C.

In another aspect of the invention, a high-frequency module comprises a transmission power amplifier device and a SAW filter provided on a dielectric substrate and is characterized in that a frequency characteristic of the SAW filter is set to a higher level than a required design value according to an estimated temperature increase of the SAW filter associated with heat generated from the transmission power amplifier device constituting.

Since the high-frequency module is required to ensure the operations thereof in a specific temperature range, the SAW filter also need to ensure the operations thereof under the same temperature conditions.

During the operation of the high-frequency amplifier circuit in an environment of an upper limit T of the aforesaid temperature range, the actual temperature of the SAW filter is further increased because of the heat generated from the power amplifier device. It is assumed that the amount of temperature increase is represented by ΔT. Therefore, the SAW filter requires its frequency characteristic to be designed based on the temperature increase.

Where k(ppm/° C.) represents a temperature coefficient of the SAW filter, a frequency change rate Δf/f(ppm) associated with the amount of temperature change ΔT(° C.) can be obtained from the following expression:

$$\Delta f/f = k \cdot \Delta T \quad (1)$$

The temperature coefficient k of the SAW filter generally takes a negative value.

Therefore, the frequency characteristic of the SAW filter is previously designed to be higher than a required design value by Δf/f described above. This ensures that the high-frequency amplifier circuit can positively operate in the specific temperature range.

By adjusting the frequency characteristic of the SAW filter based on the estimated temperature increase, the performance of the operating high-frequency amplifier circuit including the transmission power amplifier device can be ensured within the required temperature range without particularly changing the placement of the SAW filter.

In a case where the SAW filter is a band pass filter, the higher end of the pass band may be set to a higher level than the required design value. It is unnecessary to change the designed lower end of the pass band because the frequency characteristic is shifted to the low frequency side (a safe side) despite the temperature rise.

In a case where the SAW filter is a stop band filter, the higher end of the stop band may be set to a higher level than the required design value. It is unnecessary to change the designed lower end of the stop band because the frequency characteristic is shifted to the low frequency side (the safe side) despite the temperature rise.

The temperature increase of the SAW filter associated with the heat generated from the transmission power amplifier device can be readily estimated from a distance from the transmission power amplifier device.

In a case where the plural SAW filters are provided on the dielectric substrate, the temperature increase of each SAW filter associated with the generated heat can be estimated according to each distance from the transmission power amplifier device.

The invention further relates to a communication apparatus, such as a mobile phone, which incorporates therein the high-frequency module described above. By virtue of incorporating the high-frequency module, the apparatus is adapted to maintain the frequency characteristic of the high-frequency module easily. In addition, the apparatus can achieve the reduction of the size and weight thereof.

BRIEF DESCRIPTION OF THE DRAWINGS

FIG. 5(a) is a circuit diagram showing a T-type matching circuit wherein capacitors 35, 36 are inserted in series while a transmission line 37 as an inductor is inserted in parallel between the capacitors and the ground;

FIG. 5(b) is an exploded perspective view showing respective configurations of the capacitors 35, 36 and the transmission line 37 disassembled into individual dielectric layers;

FIG. 6(a) is a circuit diagram showing a matching circuit relying on only an inductor 38 connected in parallel along with the ground for matching;

FIG. 6(b) is an exploded perspective view showing a configuration of the transmission line 38 disassembled into individual dielectric layers;

DETAILED DESCRIPTION OF THE INVENTION

Figure 1:
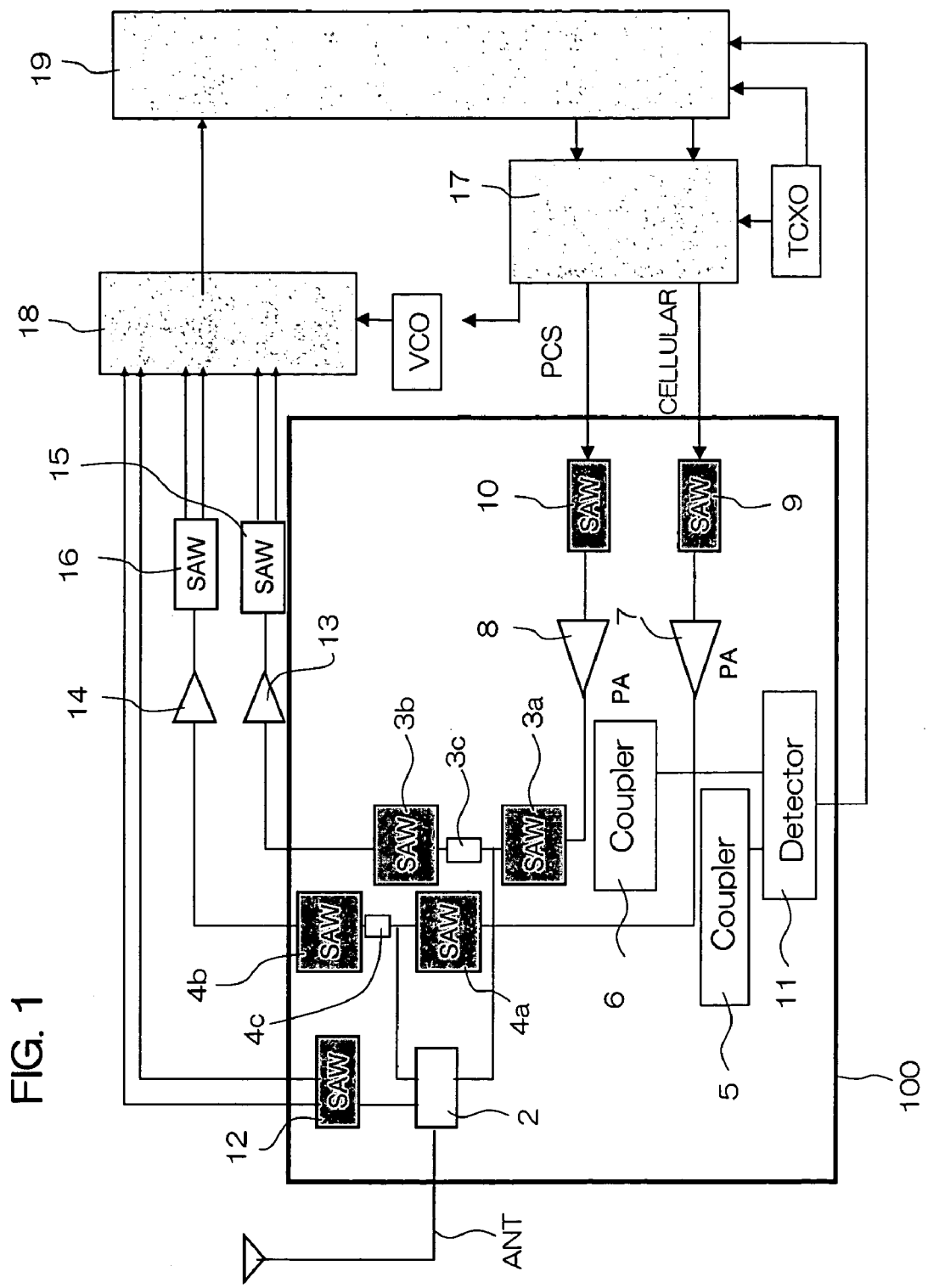
FIG. 1 is a block diagram showing a configuration of a high-frequency signal processor circuit including a high-frequency module 100 of CDMA dual-band system.

FIG. 1 is a block diagram showing a configuration of a high-frequency signal processor circuit of dual-band system, which is used in a mobile communication apparatus.

The apparatus of dual-band system comprises two transmission/reception systems having frequency bands of a 800 MHz-band for the cellular system and a 1.9 GHz-band for the PCS (Personal Communication Services) system, and one reception system having a GPS-reception band of 1.5 GHz permitting the use of a positioning function based on the GPS (Global Positioning System).

In FIG. 1, "ANT" represents an antenna; "2" represents an LC duplexer including a low pass filter and a high pass filter for separating frequency bands; "3a" represents a SAW (Surface Acoustic Wave) filter for separating the transmission system having the 1.9 GHz band; "3b" represents a SAW filter for separating the reception system having the above band; "4a" represents a SAW filter for separating the transmission system having the 800 MHz band; and "4b" represents a SAW filter for separating the reception system having the above band.

Indicated at "12" is a SAW filter for allowing the passage of a GPS signal applied from the LC duplexer 2. "3c" and "4c" each represent a matching circuit for rotating the phase of a reception signal.

A cellular transmission signal outputted from a transmission signal processor circuit 17 passes through a band pass filter 9 so as to eliminate noises therefrom and then, is sent to a high-frequency power amplifier circuit 7. On the other hand, a PCS transmission signal outputted from the transmission signal processor circuit 17 passes through a band pass filter 10 so as to eliminate noises therefrom and then, is sent to a high-frequency power amplifier circuit 8.

The high-frequency power amplifier circuits 7, 8 are operated at frequencies in the 800 MHz band and in the 1.9 GHz band, respectively, so as to amplify transmission powers. The transmission signals thus amplified pass through respective directional couplers 5, 6 so as to be inputted to the respective SAW filters 4a, 3a.

The directional couplers 5, 6 have a function to monitor a level of the output signal from the high-frequency power amplifier circuit 7, 8. A monitor signal from the coupler is inputted to a detector circuit 11. An auto-power control of the high-frequency power amplifier circuit is provided based on the monitor signal. Incidentally, it is possible to adopt an alternative method wherein the directional couplers 5, 6 are abandoned and the monitor signal is extracted from a part of a transmission line constituting a power-amplification matching circuit to be described hereinlater.

On the other hand, the reception system includes low noise amplifiers 14, 13 for amplifying the reception signals separated by the SAW filters 4b, 3b; and band pass filters 16, 15 for eliminating noises from the reception signals. The reception signals passed through the band pass filters 16, 15 are sent to a reception signal processor circuit 18 where the signals are processed. Furthermore, the GPS signal separated by the GPS SAW filter 12 is also processed by the reception signal processor circuit 18.

Although the configuration of the SAW filter device is not limited, a preferred configuration is made such that comb-like IDT (Inter Digital Transducer) electrodes are formed on a substrate comprising a piezoelectric monocrystal such as $LiTaO_3$ crystal, $LiNbO_3$ crystal, and $LiB_4O_7$ crystal.

The configuration of the high-frequency power amplifier circuits 7, 8 is not also limited. In the interest of achieving the size reduction and the increased efficiency, the circuit may preferably comprise a power amplification semiconductor device such as a GaAs transistor having a GaAsHBT (Gallium Arsenide Heterojunction Bipolar Transitor) structure or a P-HEMT structure, a silicon transistor or a germanium transistor. The power amplification semiconductor device is provided with a power amplification matching circuit at an output terminal thereof, the matching circuit responsible for converting an output impedance of the power amplification semiconductor device. The power amplification matching circuit comprises a transmission line and the like.

There exist strong demands for reducing the size and weight of the high-frequency signal processor circuit of the aforementioned configuration. In consideration of such demands, the high-frequency signal processor circuit is designed in modules in units permitting desired characteristics to be achieved.

As indicated by a bold line 22 in FIG. 1, the circuits of a multiplexer system including the LC duplexer 2, the SAW filters 3a, 3b, 4a, 4b, the high-frequency power amplifier circuits 7, 8, the directional couplers 5, 6 and the like; and the circuits of the transmission system constitute a single high-frequency module 100 formed on a single substrate.

It is also possible to adopt a mounting method wherein the high-frequency module 100 is divided into two high-frequency modules, which include a module having the 800 MHz band and a module having the 1.9 GHz band. In addition, the low noise amplifiers 13, 14 and the reception band pass filters 15, 16 may be combined together to form a module.

Next, description is made on a device layout of the single high-frequency module 100 including the 800 MHz band and the 1.9 GHz band.

Figure 2:
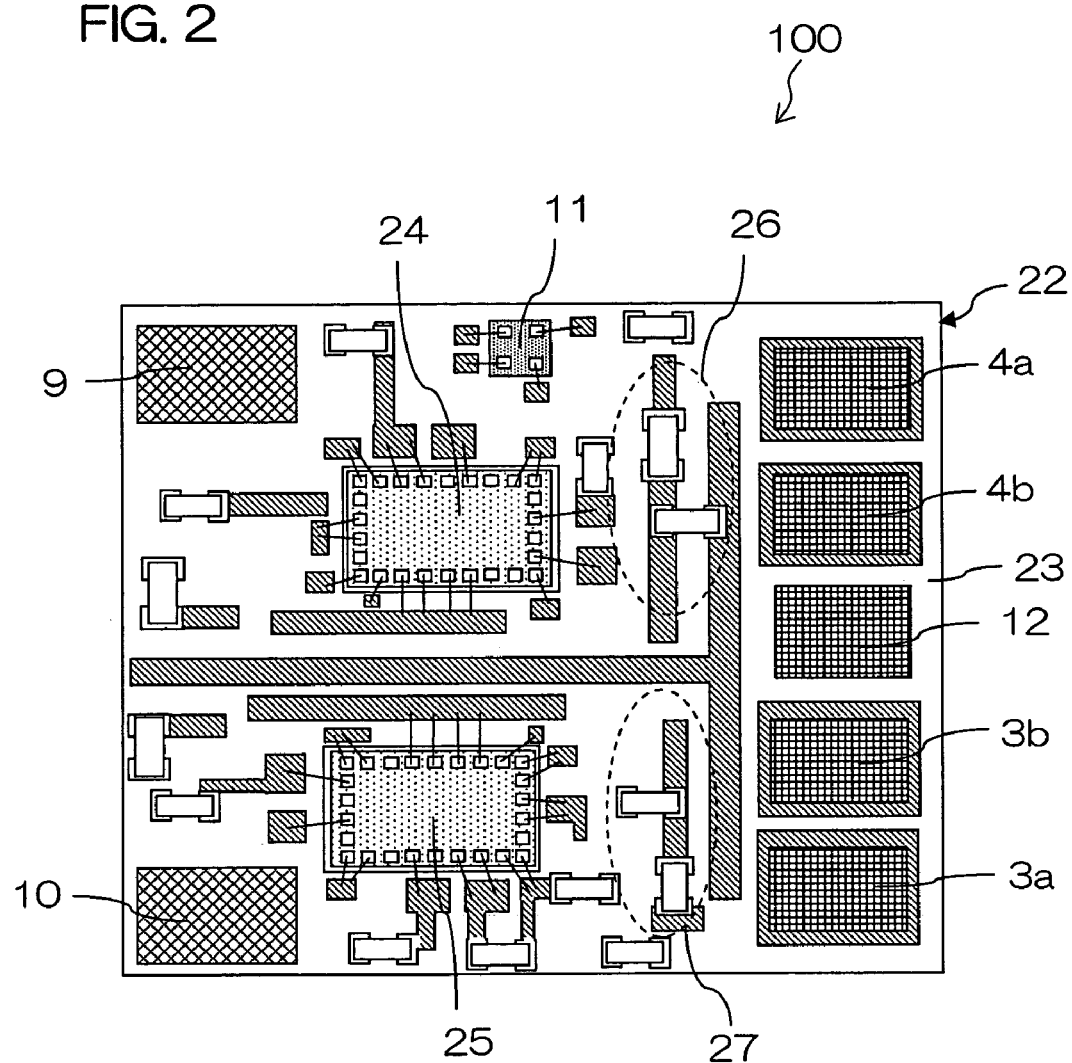
FIG. 2 is a plan view showing the whole body of the high-frequency module 100 mounted on a multilayered substrate 23.
Figure 3A:
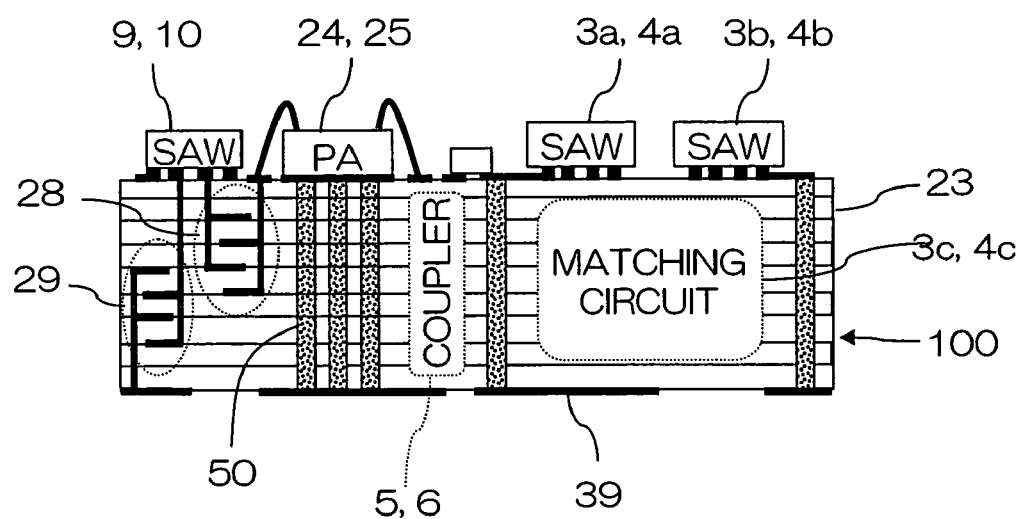
FIG. 3(a) is a sectional view showing the high-frequency module 100 mounted on the multilayered substrate 23.

FIG. 2 shows the high-frequency module 100 in plan, whereas FIG. 3(a) is a sectional view thereof. The high-frequency module 100 has a multilayered substrate structure formed by laminating 9 dielectric layers having the same size and shape. "39" represents a ground layer disposed at the lowermost layer. It is noted that the number of dielectric layers is not limited to "9". In actual fact, a much larger number of layers are laminated. The thickness of each dielectric layer forming the multilayered substrate 23 is defined to range from 50 to 300 μm.

As shown in FIG. 2, surface-mounted components such as a chip capacitor and a chip inductor are soldered to a surface layer of the multilayered substrate 23. Furthermore, the surface layer mounts thereon the band pass SAW filters 9, 10, the GPS SAW filter 12, the detector circuit 11, the SAW filters 3a, 4a, 3b, 4b, and power amplification semiconductor devices 24, 25 each of which constitutes a part of the high-frequency power amplifier circuit 7, 8. These components are connected with conductor patterns on the dielectric layer by means of solder.

The power amplification semiconductor devices 24, 25 are connected with the conductor pattern on the multilayered substrate 23 by wire bonding. Disposed around the power amplification semiconductor devices 24, 25 are power amplification matching circuits 26, 27 each of which also constitutes a part of the high-frequency power amplifier circuit 7, 8. The power amplification matching circuit comprises a chip component and a conductor pattern.

It is noted that the power amplification semiconductor devices 24, 25, the power amplification matching circuits 26, 27 and the like may be mounted on a back side of the multilayered substrate or mounted therein. The structure wherein the above components are mounted on the back side of the multilayered substrate or mounted therein will be described hereinlater with reference to FIG. 11 or FIG. 12.

As shown in FIG. 3(a), the matching circuits 3c, 4c and the directional couplers 5, 6 are formed in internal dielectric layers of the multilayered substrate 23. Furthermore, a DC-cut coupling capacitor 28 for connection between the power amplification semiconductor devices 24, 25 and the band pass SAW filters 9, 10, and a capacitor 29 for connection between the band pass SAW filters 9, 10 and the ground are also formed in the multilayered substrate.

Figure 3B:
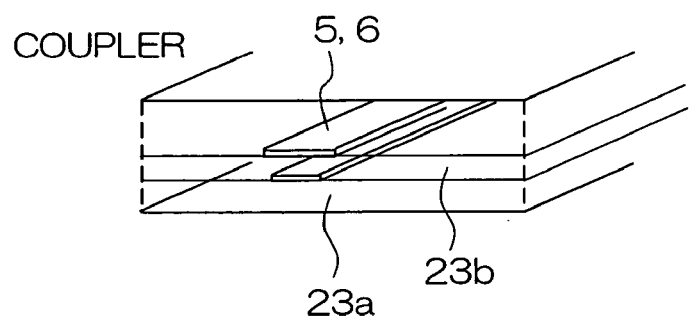
FIG. 3(b) is a perspective view of an interior of the multilayered substrate 23 for showing coupling lines of directional couplers 5, 6.

These devices (hereinafter, referred to as "internal devices") formed in the internal dielectric layers of the multilayered substrate 23 individually comprise a transmission line, a coupling line, a distributed capacitor, a resistor and the like which are formed in the dielectric layers. In FIG. 3(b) which is a perspective view of the interior of the multilayered substrate 23 for showing coupling lines of directional couplers 5, 6, for instance, the coupling lines are individually formed on two dielectric layers 23a, 23b in stacked relation.

Each of the dielectric layers is vertically formed with a via hole which extends through plural layers for vertical connection of circuits. Particularly, indicated at "50" in FIG. 3(a) is a thermal via which vertically extends through the dielectric layers for releasing heat generated by the power amplification semiconductor devices 24, 25 to the ground layer 39.

Usable dielectric layers may be fabricated as follows, for example. A conductor pattern is formed on an organic dielectric substrate such as of a glass epoxy resin, using a conductive material such as copper foil. The resultant organic dielectric layers are laminated and then are thermally cured. In an alternative method, inorganic dielectric layers such as of a ceramic material are formed with various conductor patterns and are concurrently laminated and sintered.

The use of the ceramic material, in particular, provides a thinner dielectric layer because the ceramic dielectric material normally has a dielectric constant of 7 to 25, which is higher than that of the resin substrate. Therefore, the circuit devices incorporated in the dielectric layers may be downsized and besides, a distance between the devices may also be decreased.

It is particularly preferred to use a ceramic material such as glass ceramics which can be sintered at low temperatures. This is because such a ceramic material permits the conductive pattern to be formed from copper, silver or the like having low resistance, the metals having low melting points. A via-hole conductor may be formed by plating a metal on an inside surface of a through-hole extended through the dielectric layers or filling a conductive paste in the through-hole.

The devices and components formed on the surface of the multilayered substrate 23 are sealed with a sealing resin, whereby the high-frequency module is completed. The high-frequency module having such a structure may be assembled into a compact, portable electronic apparatus such as a mobile phone.

Next, description is made on specific examples of the matching circuits 3c, 4c and their structures in the multilayered substrate.

Figure 4A:
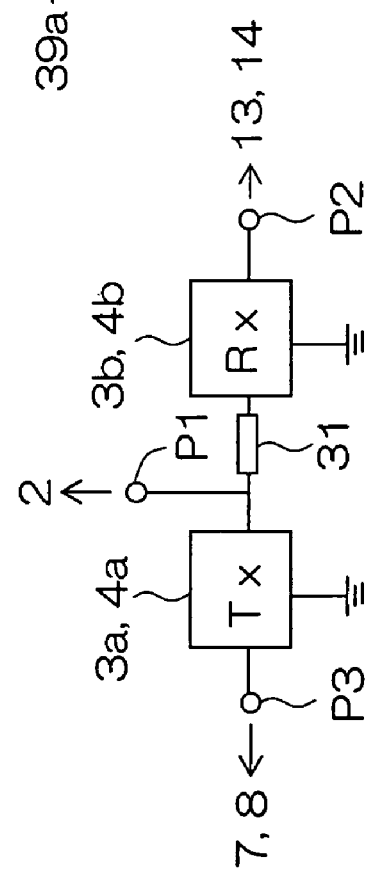
FIG. 4(a) is a circuit diagram showing a matching circuit including a transmission line 31 inserted in a fore stage of a receiving SAW filter 4b, 3b.

FIG. 4(a) illustrates an exemplary circuit of the matching circuits 4c, 3c. The matching circuit 4c, 3c comprises a transmission line 31 inserted in a fore stage of the receiving SAW filter 4b, 3b. The phase of the reception signal is rotated by a predetermined angle by means of such a transmission line 31.

Figure 4B:
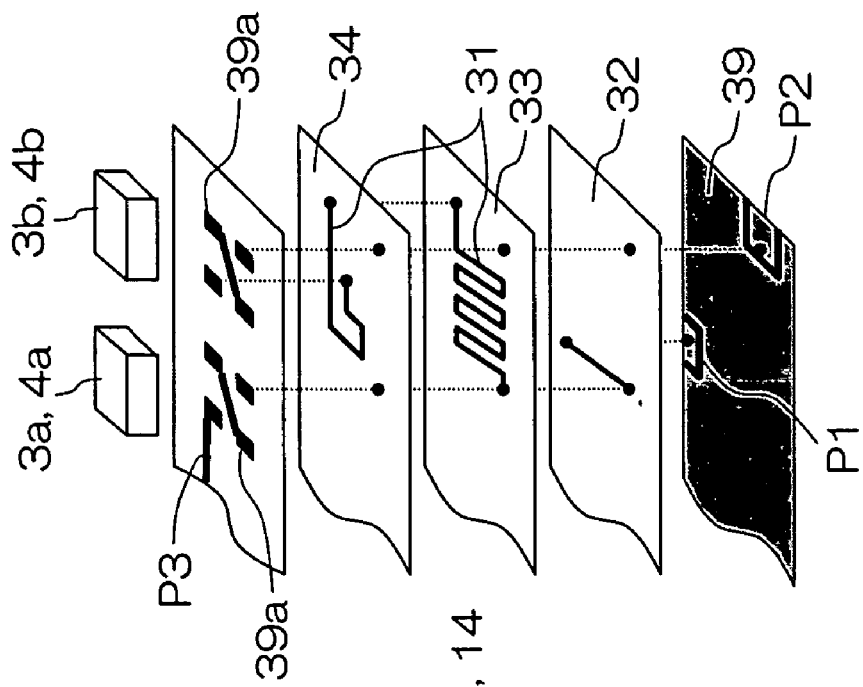
FIG. 4(b) is an exploded perspective view showing a configuration of the matching circuit disassembled into individual dielectric layers.

FIG. 4(b) is an exploded perspective view showing the individually disassembled dielectric layers, which are formed with the transmission line 31. An antenna terminal P1 connected to the LC duplexer 2 and a terminal P2 connected to the low noise amplifier 13 or 14 are formed on the lowermost dielectric layer and are connected with the upper dielectric layers via the via holes (indicated by solid dots in the figure). An intermediate dielectric layer 33 is formed with a meandering conductor pattern, one end of which is connected with the antenna terminal P1. This conductor pattern defines the transmission line 31. The other end of the conductor pattern is further extended up to the next upper layer through the via hole, and then is bent for connection with an input terminal of the SAW filter 4b, 3b on the uppermost dielectric layer. The other terminal P2 is extended through the dielectric layers to be connected with an output terminal of the SAW filter 4b, 3b. "39a" represents a grounding line.

FIG. 5(a) illustrates another exemplary circuit of the matching circuits 4c, 3c. The matching circuit 4c, 3c comprises a T-type matching circuit wherein the capacitors 35, 36 are inserted in series while a transmission line 37 as an inductor is inserted in parallel between the capacitors and the ground. Such an LC circuit is adapted to optimize the phase angle of the signal.

FIG. 5(b) is an exploded perspective view showing the individually disassembled dielectric layers which are formed with the capacitors 35, 36 and the transmission line 37. The antenna terminal P1 connected to the LC duplexer 2 and the terminal P2 connected to the low noise amplifier 13 or 14 are formed on the lowermost dielectric layer. These terminals are connected with the upper dielectric layers through the via holes (indicated by solid dots in the figure). An intermediate dielectric layer 32 is formed with a meandering conductor pattern (defining the transmission line 37), one end of which is grounded. The other end of the conductor pattern is further extended up to the next upper dielectric layer 33 through the via hole, so as to be connected with one of the conductors that define the capacitor 35. The next upper dielectric layer 34 is formed with the other conductor defining the capacitor 35. The one conductor combines with the other conductor via the dielectric layer 34 so as to form a capacitance. The other conductor is connected to the antenna terminal P1 by way of the via-hole conductor extended through the lower layers, and is also connected with a terminal of the SAW filter 3a, 4a.

On the other hand, the dielectric layer 33 is formed with one of the conductors defining the capacitor 36. The one conductor is connected with the one conductor 35 aforementioned. Formed on the one conductor 36 is the other conductor which is combined therewith via the dielectric layer 34 so as to define the capacitor 36. The one conductor combines with the other conductor via the dielectric layer 34 to form a capacitance of the capacitor 36. The other conductor of the capacitor 35 is connected with a terminal of the SAW filter 4b, 3b by way of the via-hole conductor. The other terminal of the SAW filter 4b, 3b is connected with the terminal P2.

FIG. 6(a) illustrates still another exemplary circuit of the matching circuits 4c, 3c. The matching circuit 4c, 3c uses only one inductor 38 connected in parallel along with the ground for matching.

FIG. 6(b) is an exploded perspective view showing the individually disassembled dielectric layers which are formed with a transmission line 38. The antenna terminal P1 connected to the LC duplexer 2 and the terminal P2 connected to the low noise amplifier 13 or 14 are formed on the lowermost dielectric layer. These terminals are connected with the upper dielectric layers through the via holes (indicated by solid dots in the figure). The intermediate dielectric layer 33 is formed with a spiral conductor pattern, one end of which is grounded. The conductor pattern defines the transmission line 38. The conductor pattern is extended up to the next upper dielectric layer 34 through the via hole as spirally bending, and then is further bent to be connected with the antenna terminal P1 and with the SAW filter 4*a*, 3*a* on the uppermost dielectric layer. On the other hand, the terminal P2 extends through the dielectric layers to be connected with the other terminal of the SAW filter 4*b*, 3*b*.

Next, detailed descriptions will hereinbelow be made on sealing structures of the SAW filter chip, mounting structures of the chip on the dielectric substrate, and modes of the high-frequency module.

Figure 7:
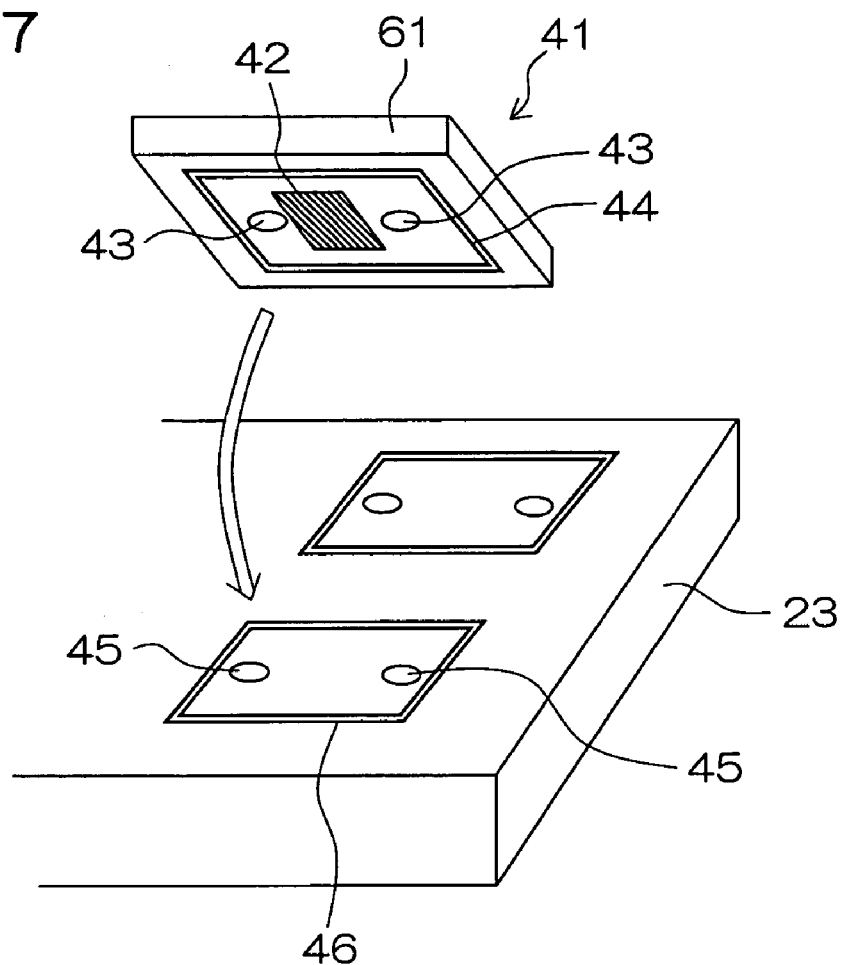
FIG. 7 is a perspective view showing how a SAW filter chip 41 is flip-chip mounted directly on the multilayered substrate 23.

FIG. 7 is a perspective view showing a process in which a chip of the SAW filter 3*a*, 4*a*, 3*b*, 4*b* is flip-chip mounted directly on an upper layer of the multilayered substrate 23. Hereinafter, a bare chip of the SAW filter 3*a*, 4*a*, 3*b*, 4*b* will be referred to as a "SAW filter chip 41".

Figure 8:
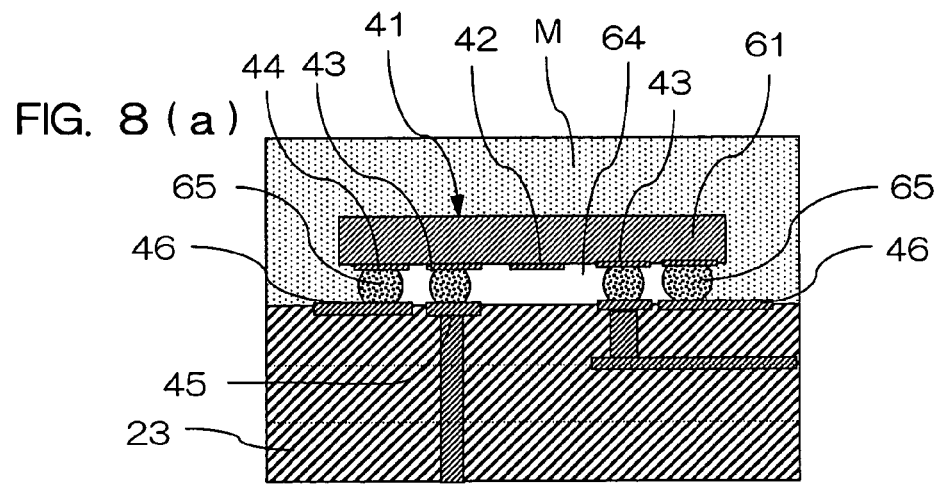
FIG. 8(a) is a schematic sectional view showing a mode of mounting the SAW filter chip according to the invention.
FIG. 8(b) is a plan view showing a surface pattern of the SAW filter chip.
FIG. 8(c) is a surface pattern diagram of a module substrate.
Figure 8:
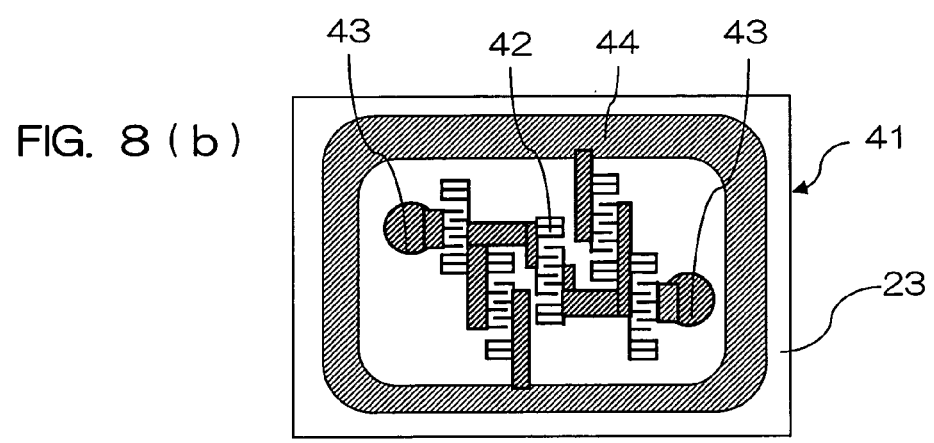
Figure 8:
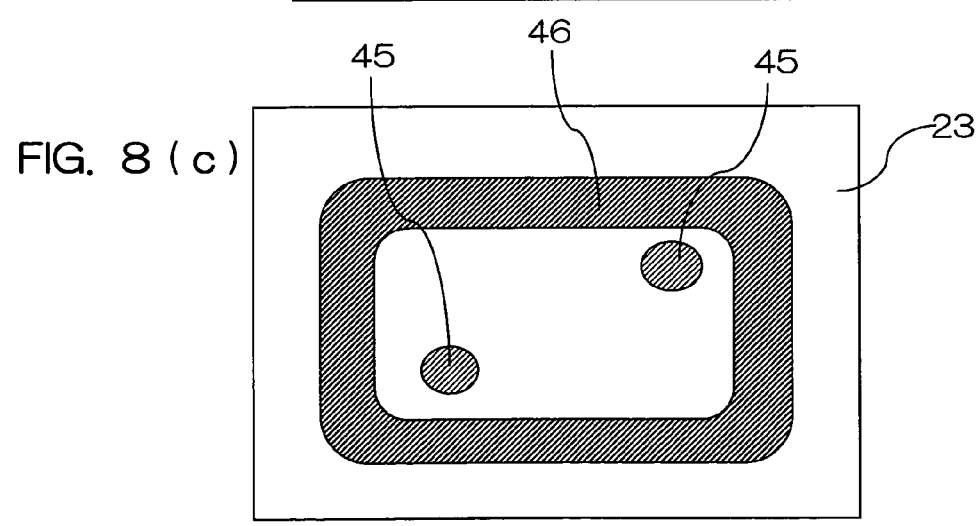

FIG. 8(*a*) is a schematic sectional view showing a mounting structure wherein the SAW filter chip 41 is face-down bonded to the surface of the dielectric substrate 23. FIG. 8(*b*) is a plan view showing a conductor pattern on a surface of the SAW filter chip 41. FIG. 8(*c*) is a plan view showing a conductor pattern of the dielectric substrate 23 to mount the SAW filter chip 41 of FIG. 8(*b*).

The SAW filter chip 41 includes a substrate 61 formed from a piezoelectric monocrystal and formed with a plurality of IDT electrodes 42 on its surface. Such an IDT electrode 41 is provided with an input/output electrode 43 at one end thereof. Formed around these IDT electrodes 42 and the input/output electrodes 43 is a ground electrode 44.

As required, a semiconductive or insulative protection film, such as of silicon or silicon oxide, is formed over these electrodes.

On the surface of the dielectric substrate 23, on the other hand, an input/output electrode 45 is formed at place corresponding to the input/output electrode 43 of the SAW filter chip 41, the electrode 45 formed of a conductive material such as silver, copper or gold. Furthermore, a ground electrode 46 is deposited on place corresponding to the ground electrode 44.

A solder layer 65 may be formed by printing a solder on the multilayered substrate 23, mounting thereon necessary chip components, and reflowing the solder. In this case, a Ni-based gold plating, for example, may preferably be deposited on the electrodes on the multilayered substrate 23 in order to improve solder wettability. Incidentally, the solder layer 65 may be replaced by a conductive resin layer.

The SAW filter chip 41 is thermal compression bonded to these patterns on the multilayered substrate 23 thereby sealing the same. According to such a bonding structure, a portion formed with the IDT electrodes 42 is sealed in a space 64 defined by the SAW filter chip 41, the dielectric substrate 23 and the solder layer 65. The structure eliminates the necessity for a large volume for sealing the SAW filter chip 41, so that the structure can realize a thin design. Furthermore, the structure not only prevents moisture and foreign substances such as dusts from adhering to the IDT electrodes 42 but also provides hermetical sealing of the electrodes in the hollow space such as not to impede the propagation of the SAW.

Subsequently, the power amplification semiconductor devices 24, 25 are mounted on the multilayered substrate 23 and connected therewith by wire bonding. The overall surface of the multilayered substrate is sealed with an epoxy resin or the like, thereby completing the high-frequency module.

Figure 9:
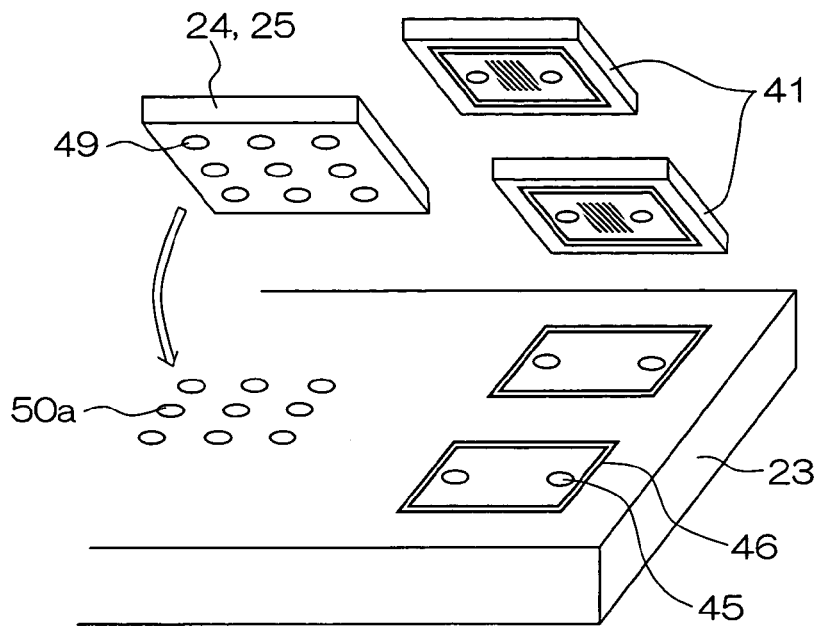
FIG. 9 is a perspective view showing how power amplification semiconductor devices 24, 25 are flip-chip mounted.

It is noted that the power amplification semiconductor devices 24, 25 in a flip-chip structure may be mounted, instead of being mounted by wire bonding. FIG. 9 is a perspective view showing how the power amplification semiconductor devices 24, 25 having the flip-chip structure are mounted on the substrate 23.

In FIG. 9, "49" represents a bump electrode of the power amplification semiconductor device 24, 25. Indicated at "50*a*" is a connection electrode disposed on the surface of the multilayered substrate 23. The electrode 50*a* is connected with the aforementioned thermal via 50.

While the structure of the high-frequency module 100 has been fully described, it is noted that the practice of the invention is not limited to the above embodiments. For instance, FIG. 3 illustrates the example where the multilayered substrate 23 contains therein the matching circuits 3*c*, 4*c*, the directional couplers 5, 6 and the capacitors 28, 29. However, the multilayered substrate may also contain therein a device constituting the LC duplexer 2.

Figure 10:
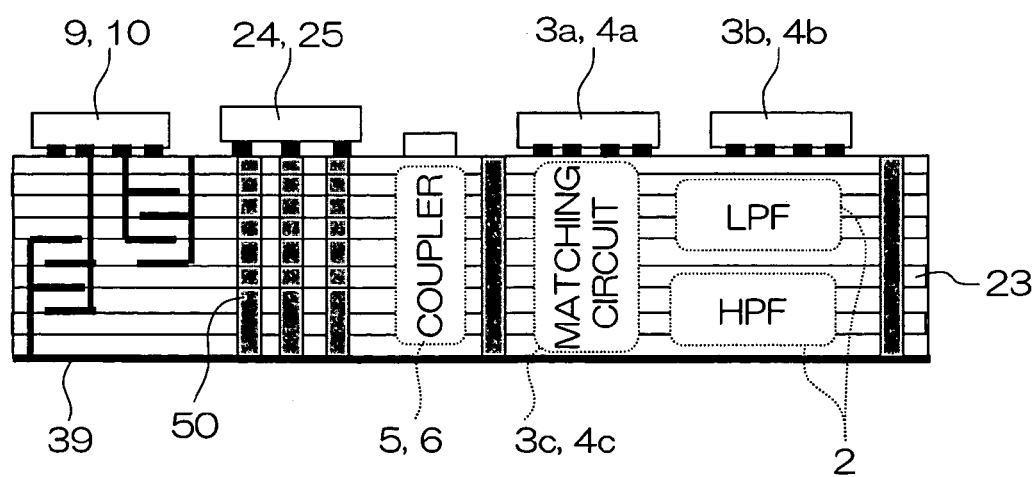
FIG. 10 is a sectional view showing the multilayered substrate 23 containing therein a low-pass filter and a high-pass filter constituting an LC duplexer 2.

Specifically, a low pass filter and a high pass filter constituting the LC duplexer 2 maybe incorporated in the multilayered substrate 23, as shown in FIG. 10. This contributes to the downsizing of the whole body of the module.

In addition, the module may be further downsized by vertically mounting the SAW filter chip 41 in the multilayered substrate 23.

Figure 11:
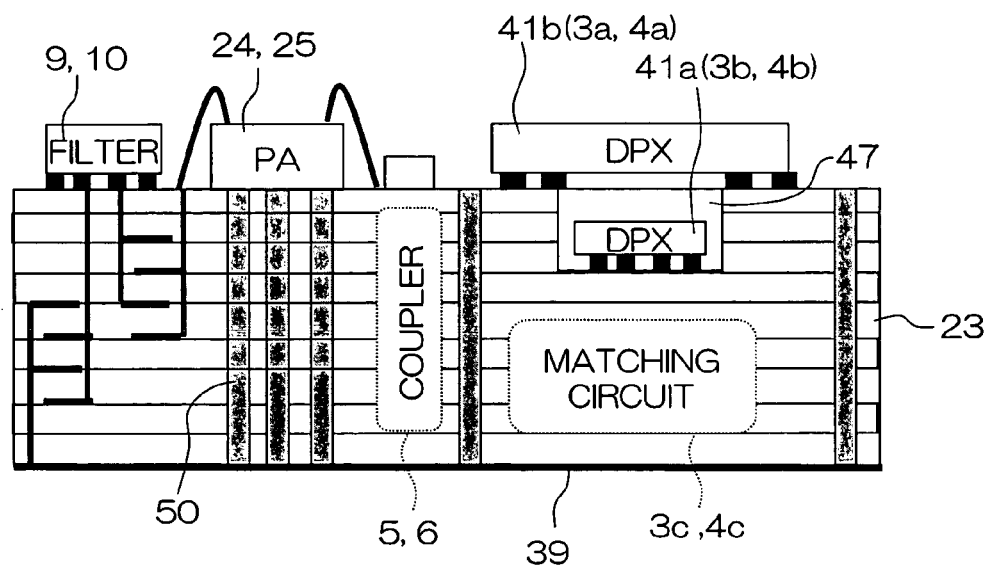
FIG. 11 is a sectional view showing the multilayered substrate 23 formed with a cavity 47 in its surface, which cavity accommodates therein a SAW filter chip 41a on which another SAW filter chip 41b is flip-chip mounted.

FIG. 11 shows a mounting structure wherein the multilayered substrate 23 is formed with a cavity 47 in its surface, which accommodates therein a SAW filter chip 41*a*, on which another SAW filter chip 41*b* is flip-chip mounted. Thus, the surface area of the module can be reduced dramatically. As to the SAW filter, in particular, the filters 3*a*, 4*a* on the transmission side have a power-resistant structure so that the filters 3*a*, 4*a* are larger in size than the filters 3*b*, 4*b* on the reception side. Therefore, such a mounting arrangement provides an effective use of the surface area of the module.

Figure 12:
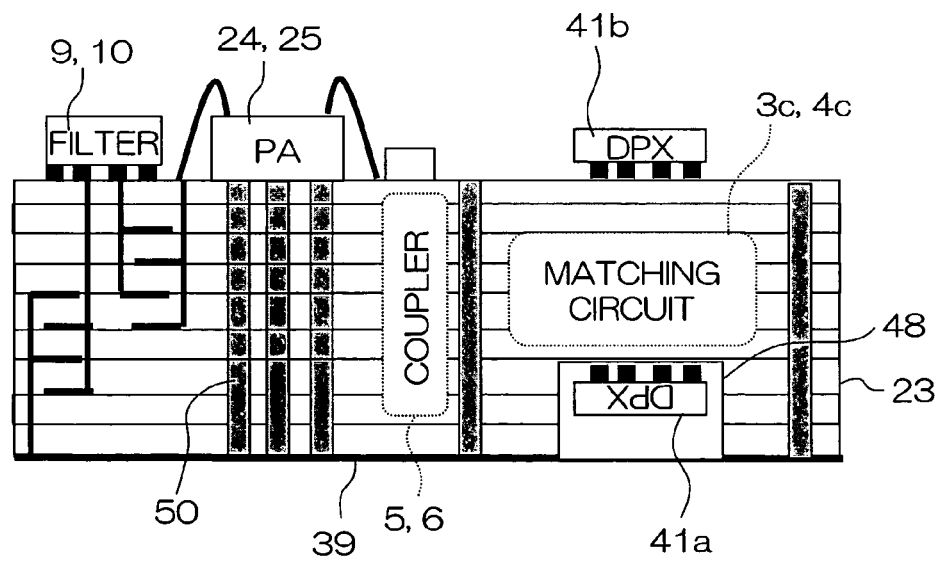
FIG. 12 is a sectional view showing the multilayered substrate 23 formed with a cavity 48 in its back side, which cavity accommodates therein the SAW filter chip 41a on which another SAW filter chip 41b is flip-chip mounted.

FIG. 12 shows a mounting structure wherein the multilayered substrate 23 is formed with a cavity 48 in its back side, which accommodates therein the SAW filter chip 41*a*, whereby the module is downsized.

In this manner, the high-frequency module can achieve the size reduction by forming the cavity 47 or 48 in the surface or the back side of the substrate and accommodating therein roughly one half of the SAW elements. Other various modifications may be made within the scope of the invention.

Next, description is made on the configuration of the matching circuits 3*c*, 4*c* connected with the SAW filters on the reception side. In the following examples, the SAW filter chip 41 is mounted on a substrate 54. The SAW filter chip 41 and the substrate 54 are packaged. This package will be referred to as a "SAW package 40".

Figure 13:
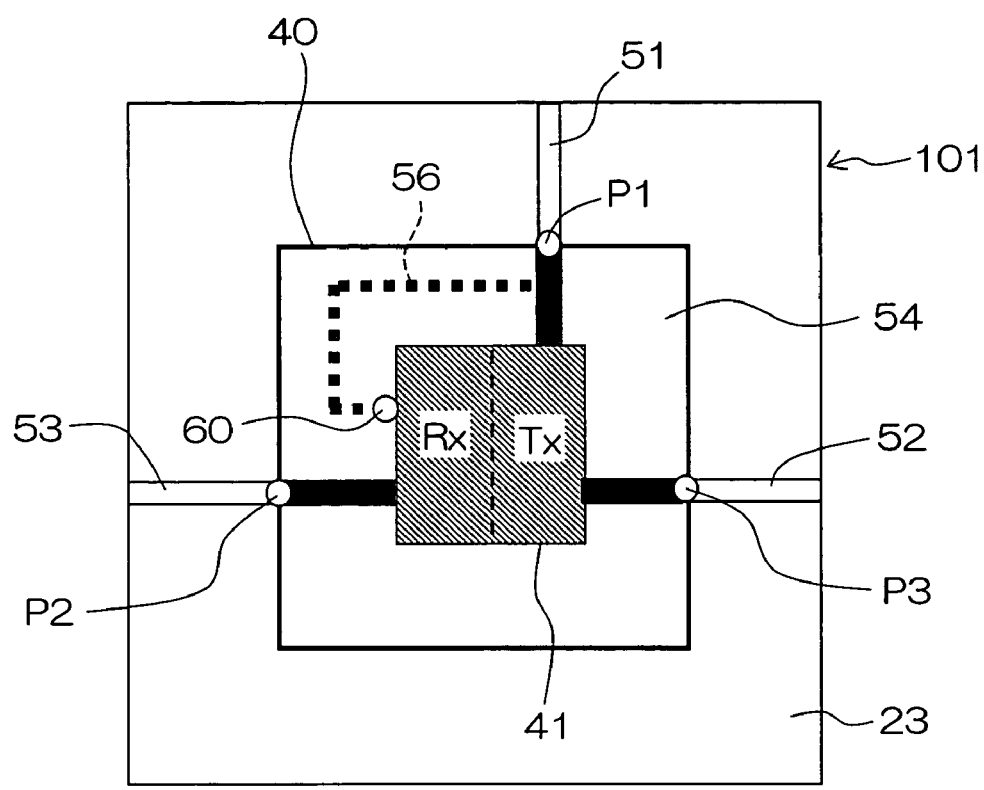
FIG. 13 is a schematic plan view of a high-frequency module 101 for illustrating a configuration of a matching circuit.
Figure 14:
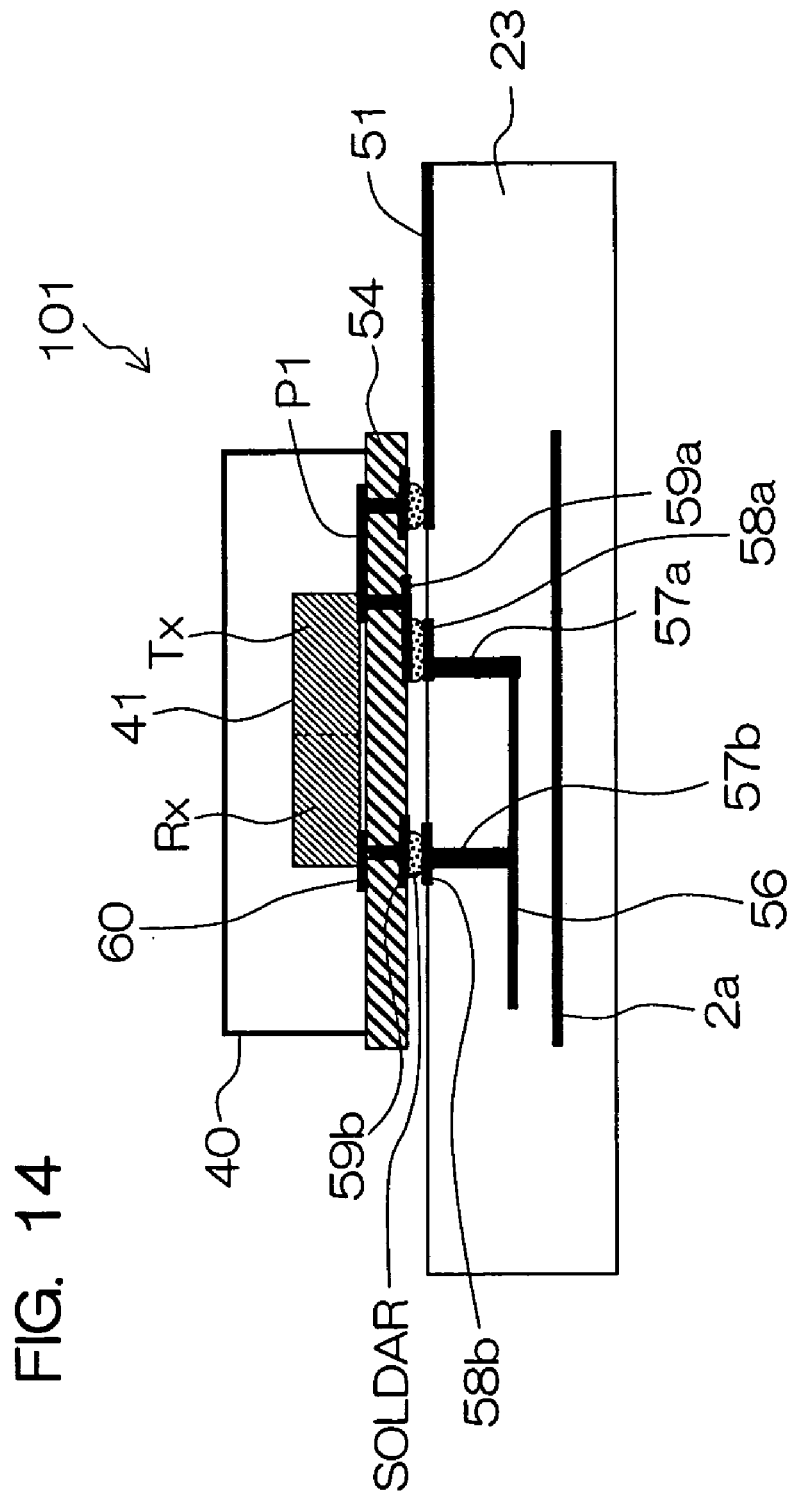
FIG. 14 is a sectional view of the above.
Figure 15:
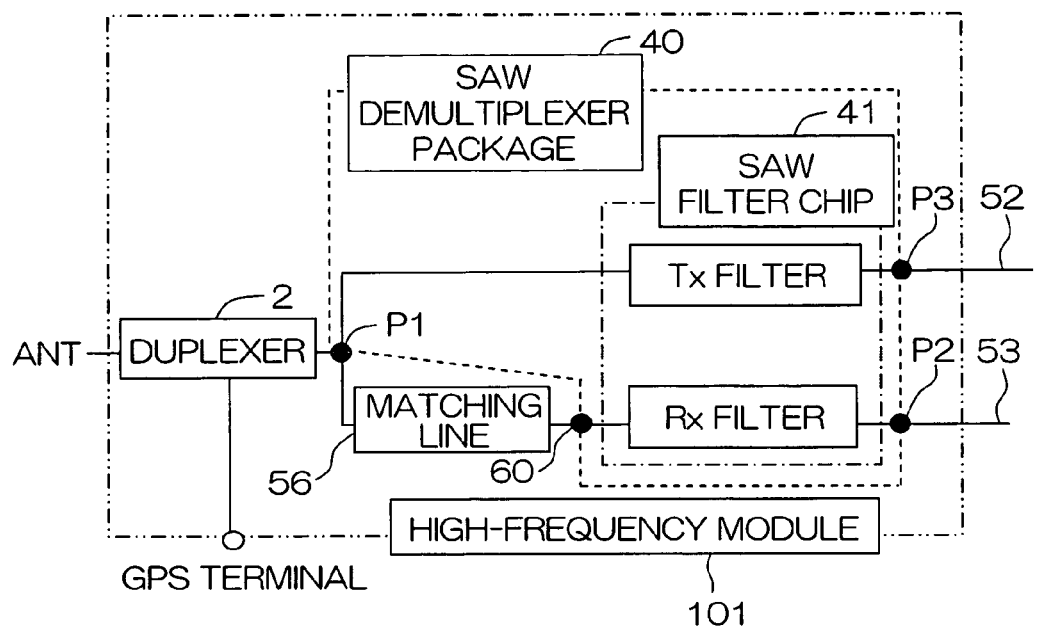
FIG. 15 is a block diagram showing a circuit configuration of the above.

FIG. 13 is a schematic plan view showing an essential part of a high-frequency module 101, whereas FIG. 14 is a sectional view thereof. FIG. 15 is a block diagram showing a circuit configuration of the high-frequency module 101.

Referring to these figures, the SAW package 40 is mounted on the multilayered substrate 23. The SAW package 40 includes three terminals which include a terminal P1 connected to the LC duplexer 2, a receiver-side terminal P2, and a transmitter-side terminal P3. The terminal P1, the transmitter-side terminal P3 and the receiver-side terminal P2 are connected with a line 51 connected to the LC duplexer 2 on the multilayered substrate 23, a line 52 connected to the high-frequency power amplifier circuit 7, 8, and a line 53 connected to the low noise amplifier 14, 13, respectively. It is noted that the LC duplexer 2 is not depicted in FIG. 13. In the case of a single band high-frequency module, an arrangement may be made which abandons the LC duplexer 2 and connects the terminal P1 directly with the antenna.

The SAW package 40 comprises a single SAW filter chip 41 mounted on the substrate 54 formed from a resin or ceramics, the SAW filter chip including a Tx filter and an Rx filter formed on a single piezoelectric substrate.

The multilayered substrate 23 contains therein a matching circuit defined by a transmission line 56. As shown in FIG. 14, the transmission line 56 is electrically connected with connection pads 58*a*, 58*b* on the surface of the multilayered substrate 23 by way of via-hole conductors 57*a*, 57*b* extended vertically through the multilayered substrate 23.

In FIG. 14, indicated at "2*a*" are an inductor device and a capacitor device constituting the LC duplexer 2 contained in the multilayered substrate 23. By incorporating the LC duplexer 2 in the multilayered substrate 23 in this manner, a more sophisticated multiband high-frequency module may be made compact.

On the other hand, an output terminal of the TX filter of the SAW filter chip 41 is extended through the substrate 54 to a terminal pad 59*a* disposed on a back side of the substrate 54. A matching terminal 60 of the Rx filter is extended through the substrate 54 to a terminal pad 59*b* disposed on the back side of the substrate 54.

In a state where the SAW package 40 is mounted on the multilayered substrate 23, the terminal pad 59*a* is bonded to the connection pad 58*a* on the surface of the multilayered substrate 23 by soldering, whereas the terminal pad 59*b* is bonded to the connection pad 58*b* on the surface of the multilayered substrate 23 by soldering.

A signal propagation path in the aforementioned high-frequency module 101 will be described with reference to FIG. 15. The transmission signal inputted through the Tx-side line 52 of the multilayered substrate 23 is inputted to the Tx filter of the SAW filter chip 41 via the transmitter-side terminal P3 of the SAW package 40. The output signal from the Tx filter is applied to the LC duplexer 2 via the terminal P1 of the SAW package 40.

On the other hand, the reception signal inputted through the line 51 connected with the LC duplexer 2 on the multilayered substrate 23 is inputted to the matching circuit via the terminal P1 of the SAW package 40 and the via hole 57*a* extended from the terminal pad 59*a* to the inside of the multilayered substrate 23, the matching circuit constituted by the transmission line 56 contained in the multilayered substrate 23. The signal propagated through the matching circuit is applied to the matching terminal 60 via the via hole 57*b* and the terminal pad 59*b*, the matching terminal 60 disposed at the Rx filter of the SAW filter chip 41 in the SAW package 40. The output signal from the Rx filter is applied to the Rx line 53 on the multilayered substrate via the receiver-side terminal P2 of the SAW package 40.

As shown in FIG. 15, the LC duplexer 2 has another output terminal connected to a GPS circuit for demultiplexing the GPS signal.

FIG. 13 and FIG. 14 described above are schematic diagrams for illustrating one exemplary structure of the high-frequency module. Hence, the positions of the terminals such as the terminal P1 connected with the LC duplexer 2, the transmitter-side terminal P3, the receiver-side terminal P2 and the matching terminal 60, and the layout of the via holes 57*a*, 57*b*, the transmission line 56 and such shown in FIG. 13 and FIG. 14 are not limited to the above but may be arbitrarily arranged.

The material and manufacturing method for the substrate 54 of the SAW package 40 are the same as those for the aforementioned multilayered substrate 23 and hence, the description thereof is dispensed with.

The transmission line 56 is formed on a green sheet on the dielectric substrate by pattern printing, coating or the like. The transmission line may take a linear shape or any of bent shapes such as spiral and meander. This provides for the size reduction of the whole body of the module. In a case where some capacitance is wanted between the transmission line and the ground, there may be added a capacitor utilizing the dielectric constant of a dielectric material interposed between interconnecting conductor layers.

Figure 40:
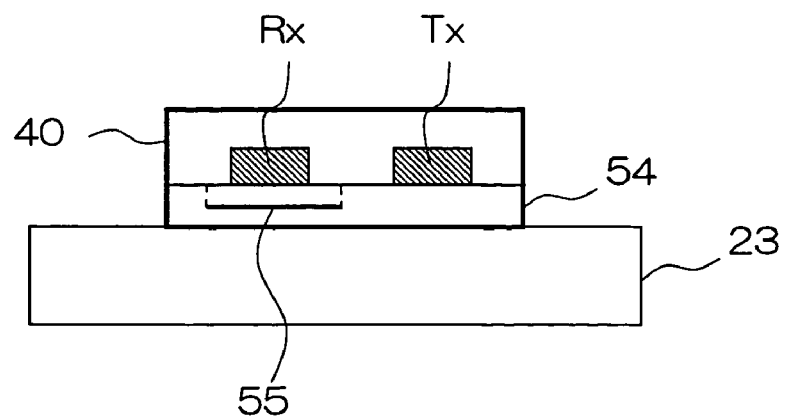
FIG. 40 is a schematic sectional view showing a configuration of a conventional high-frequency module mounting a SAW filter package 40.

According to a conventional method, the SAW package 40 is constructed such that, as shown in FIG. 40, a transmitting Tx filter chip and a receiving Rx filter chip are independently mounted on the multilayered substrate 23. The substrate 54 in the chip contains therein a matching line 55 for providing matching between the antenna terminal and the Rx filter chip.

Figure 41:
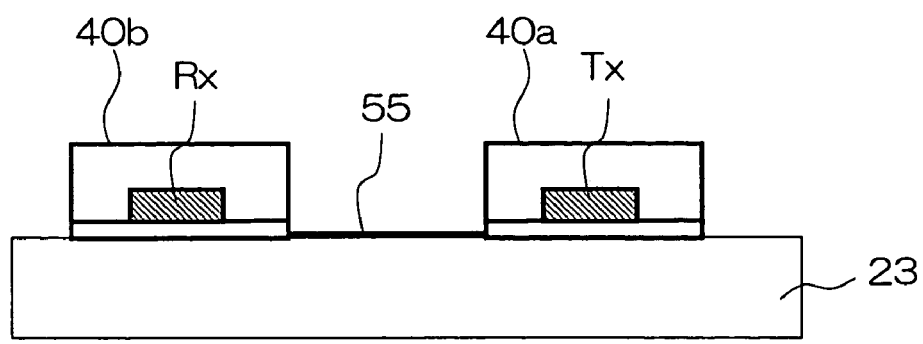
FIG. 41 is a schematic sectional view showing a configuration of a conventional high-frequency module mounting SAW filter packages 40a, 40b.

According to another conventional method, as shown in FIG. 41, the multilayered substrate 23 mounts thereon a transmitting SAW package 40*a* and a receiving SAW package 40*b*, while the matching line 55 is formed on the surface of the multilayered substrate 23 for providing matching between the antenna terminal and the Rx input terminal.

However, the fabrication of the high-frequency module using the aforementioned conventional method encounters the following problems. In the structure shown in FIG. 40, the high-frequency module has a great height because the matching line 55 is embedded in the substrate 54. Accordingly, it is quite difficult to further reduce the thickness of the module.

In the structure shown in FIG. 41, the transmitting SAW package 40*a* and the receiving SAW package 40*b* are independently formed and hence, it is difficult to uniformalize the characteristics of these packages. This results in great variations in the package characteristics. In addition, the package has a great surface area which cannot be decreased any further.

According to the high-frequency module 101 having the structure of the invention, however, the transmission line 56 is formed within the multilayered substrate 23, as shown in FIG. 14, so that the substrate 54 can be reduced in thickness.

Since the Tx filter and the Rx filter are formed on the same piezoelectric substrate to define a single chip, as shown in FIG. 13, the package may have a reduced surface area.

As shown in FIG. 13, the high-frequency module 101 comprises a package block constituted by the Tx filter and the Rx filter, whereas the transmission line 56 is laid between the terminal P1 and the Rx filter. This permits the module to adjust the impedance of the Rx filter, thereby achieving the optimum SAW filter characteristics.

While the high-frequency module 101 as described above comprises the LC duplexer 2, the invention may also be practiced in a single band high-frequency module which abandons the LC duplexer 2 and connects the terminal P1 directly with the antenna. In this case, as well, the SAW package 40 has the same structure as in the foregoing.

Figure 16:
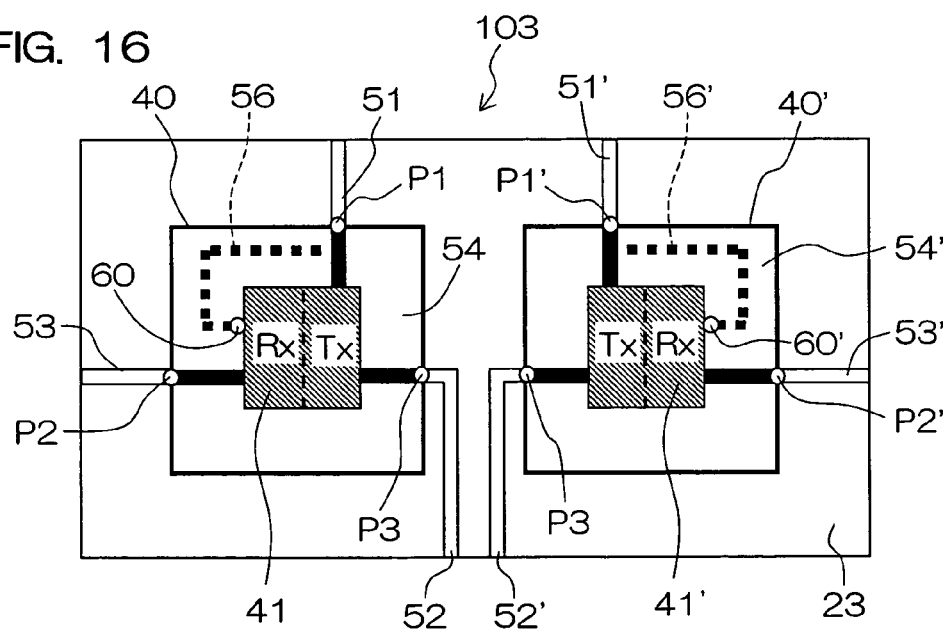
FIG. 16 is a schematic plan view showing a high-frequency module 103 including SAW filter packages 40, 40' corresponding to two bands.
Figure 17:
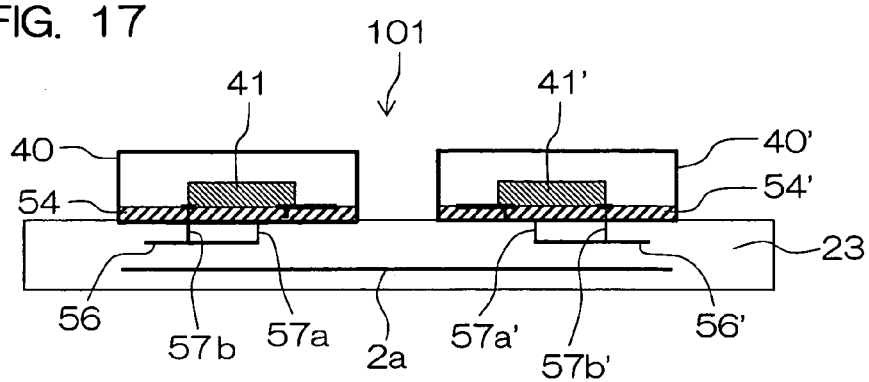
FIG. 17 is a sectional view showing the above high-frequency module 103.
Figure 18:
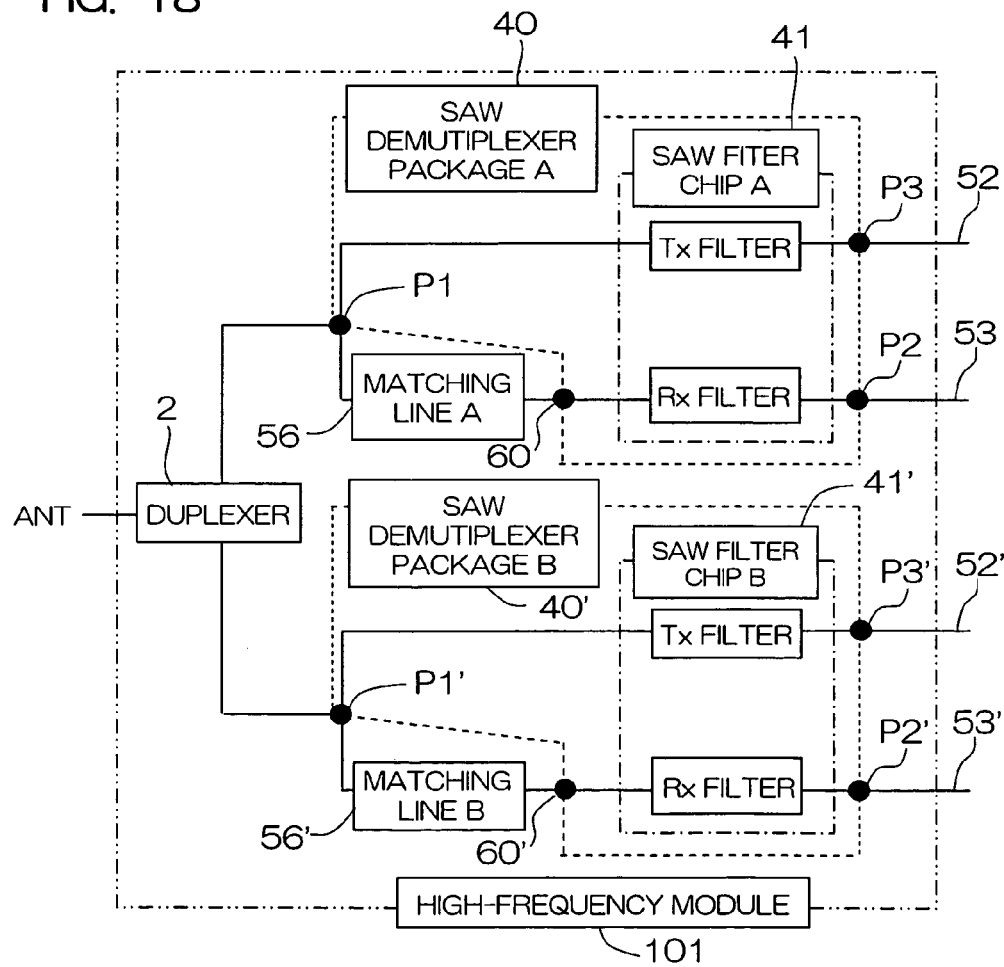
FIG. 18 is a block diagram showing a circuit configuration of the above high-frequency module 103.

FIG. 16 is a schematic plan view showing a high-frequency module 103 having still another structure, whereas FIG. 17 is a sectional view thereof. FIG. 18 is a block diagram showing a circuit configuration of the high-frequency module 103.

A difference from the high-frequency module 101 shown in FIG. 13 through FIG. 15 consists in that another SAW package 40' having a different frequency band is mounted on the same multilayered substrate 23. For instance, the SAW package 40 handles the 800 MHz frequency band whereas the added SAW package 40' handles the 1.9 GHz frequency band.

Similarly to the SAW package 40, the SAW package 40' comprises three terminals including: a terminal P1' connected with the LC duplexer 2, a transmitter-side terminal P3', and a receiver-side terminal P2', which are connected with a line 51' connected with the LC duplexer 2 on the multilayered substrate 23, a Tx-side line 52', and an Rx-side line 53', respectively. The SAW package 40' has a structure wherein a substrate 54' mounts thereon a single SAW filter chip 41' including a TX filter and an Rx filter formed on the same piezoelectric substrate, and wherein a multilayered substrate 23' contains therein a matching circuit defined by a transmission line 56' just as in the foregoing embodiment. The connection mode and the function of the transmission line 56' are the same as those described with reference to FIG. 13 through FIG. 15.

While FIG. 16 and FIG. 17 show the SAW packages 40, 40' operative at two different frequency bands are arranged in plane symmetry or in a mirror-like fashion, the details of the layout are not limited to the above.

Referring to FIG. 16 through FIG. 18, the invention may also includes an exemplary high-frequency module wherein the LC duplexer 2 is adapted for three frequency bands, and has another output terminal connected with the GPS circuit. The embodiment provides a compact high-frequency module which is capable of handling multiple channels and besides, has a GPS function.

In the construction of the aforementioned high-frequency modules, the other necessary components such as the high-frequency power amplifier circuit and the low noise amplifier circuit may be mounted on the same multilayered substrate, such that a compact high-frequency signal processor circuitry may be formed using a single multilayered substrate.

Figure 19:
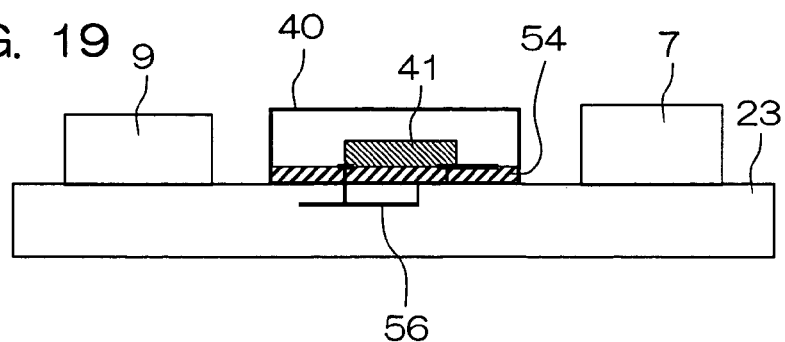
FIG. 19 is a sectional view showing an example where a high-frequency power amplifier circuit 7 and a band pass filter 9 are mounted on the multilayered substrate along with the SAW filter package.

FIG. 19 illustrates an example of a high-frequency module wherein the SAW package 40, the high-frequency power amplifier circuit 7 and the band pass SAW filter 9 are mounted on the same multilayered substrate 23. While the high-frequency power amplifier circuit and the band pass filter are added in this example, any other component may also be added to the high-frequency module.

Figure 20:
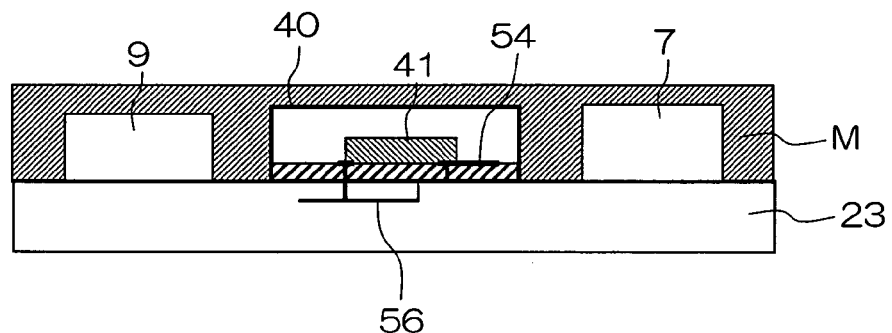
FIG. 20 is a sectional view showing a mold resin M overlaid on top of the multilayered substrate 23 for covering up the mounted components.

It is preferred that after the individual modules are mounted on the multilayered substrate, the whole body of the modules is resin molded. FIG. 20 is a sectional view showing a mold resin M overlaid on top of the multilayered substrate 23 for covering up the mounted components.

Figure 21:
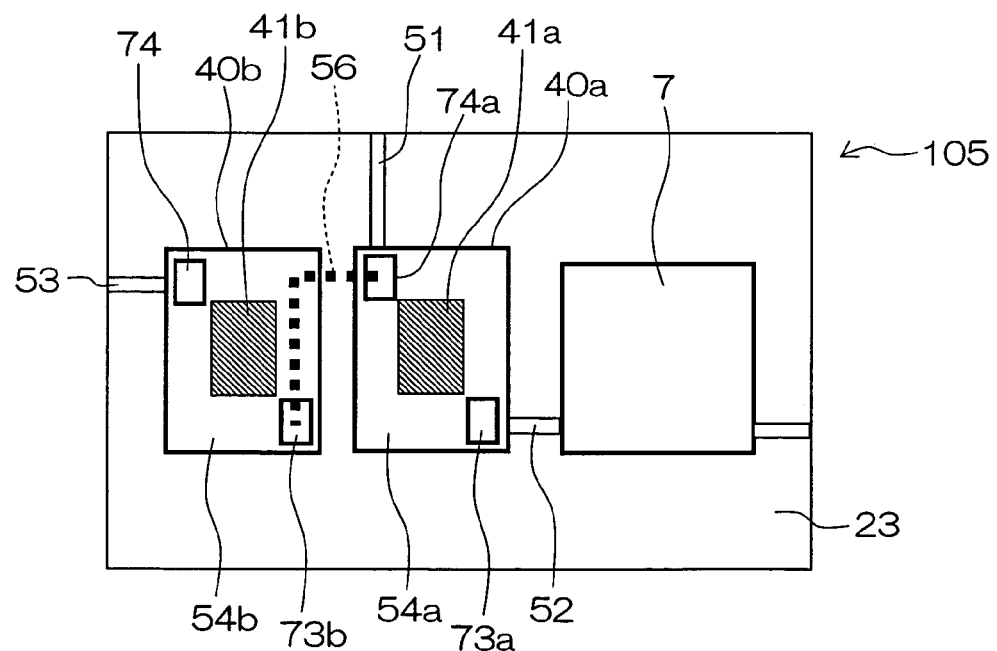
FIG. 21 is a schematic plan view showing a high-frequency module 105 according to another embodiment of the invention, the module wherein a TX filter and an Rx filter are formed separately.
Figure 22:
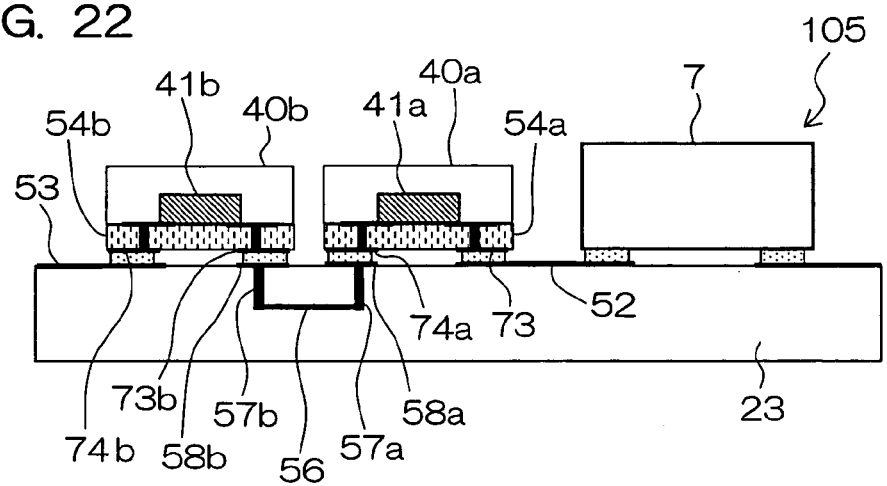
FIG. 22 is a sectional view showing the above high-frequency module 105.
Figure 23:
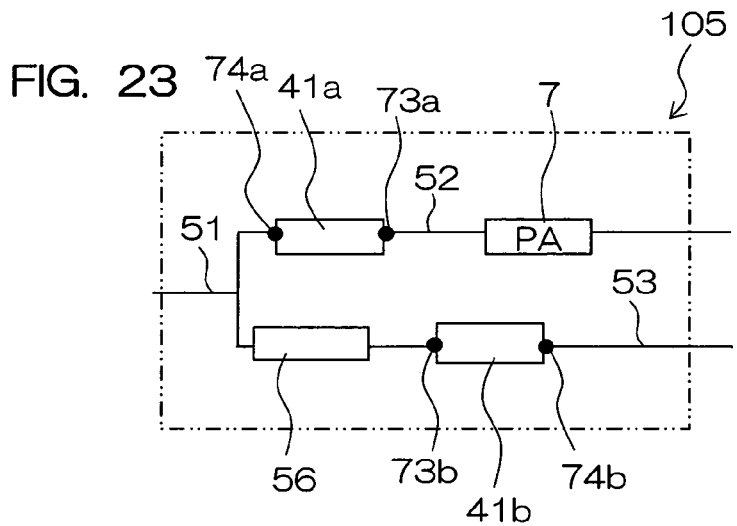
FIG. 23 is a block diagram showing a circuit configuration of the above high-frequency module 105.

FIG. 21 is a schematic plan view showing a high-frequency module 105 according to another embodiment of the invention, the module wherein a TX filter and an Rx filter are separately formed, whereas FIG. 22 is a sectional view thereof. FIG. 23 is a block diagram showing a circuit configuration of the high-frequency module 105.

Referring to these figures, the multilayered substrate 23 mounts thereon the transmitting SAW filter package 40a, the receiving SAW filter package 40b and the high-frequency power amplifier circuit 7.

A Tx input terminal 73a of the transmitting SAW filter package 40a is connected with the Tx line 52 on the multilayered substrate 23, whereas a Tx output terminal thereof is connected with the line 51 connected with the antenna. The Tx line 52 is further connected with the high-frequency power amplifier circuit 7. On the other hand, an Rx output terminal 74b of the receiving SAW filter package 40b is connected with the Rx line 53 on the multilayered substrate 23. The Rx line 53 is connected with a receiver amplifier.

In some cases, as will be described hereinlater with reference to FIG. 26 and FIG. 27, the line 51 "connected with the antenna" may be connected with the LC duplexer 2.

As shown in FIG. 22, the transmitting SAW filter package 40a has a structure wherein the SAW filter chip 41a including the filter electrode formed on the piezoelectric substrate is mounted on a substrate 54a formed from a resin or ceramics. Likewise, the receiving SAW filter package 40b has a structure wherein the SAW filter chip 41b including the filter electrode formed on the piezoelectric substrate is mounted on a substrate 54b formed from a resin or ceramics.

On the other hand, the multilayered substrate 23 contains therein the matching circuit defined by the transmission line 56. As shown in FIG. 22, the matching circuit is electrically connected with the connection pads 58a, 58b on the multilayered substrate 23 by way of via-hole conductors 57a, 57b vertically extended through the multilayered substrate 23.

A filter input terminal and a filter output terminal of the SAW filter chip 41a are extended through the substrate 54a to the input terminal 73a and the output terminal 74a disposed on a back side of the substrate 54a. Likewise, a filter input terminal and a filter output terminal of the SAW filter chip 41b are extended through the substrate 54b to the input terminal 73b and the output terminal 74b disposed on a back side of the substrate 54b. With the SAW filter packages 40a, 40b mounted on the multilayered substrate 23, the Tx input terminal 73a is connected with the Tx line 52 on the surface of the multilayered substrate 23; the Tx output terminal 74a is connected with the connection pad 58a on the surface of the multilayered substrate 23; the Rx input terminal 73b is connected with the connection pad 58b on the surface of the multilayered substrate 23; and the Rx output terminal 74b is connected with the Rx line 53 on the surface of the multilayered substrate 23. The interconnections are accomplished by soldering or the like.

A signal propagation path of the high-frequency module 105 will be described with reference to FIG. 22 and FIG. 23. The transmission signal is amplified by the high-frequency power amplifier circuit 7 and then, is inputted to the SAW filter chip 41a via the Tx line 52. The signal outputted from the SAW filter ship 41a is outputted to the line 52 on the multilayered substrate 23 via the Tx output terminal 74a.

On the other hand, the reception signal inputted from the line 52 on the multilayered substrate 23 is inputted to the matching circuit the via hole 57a extended into the multilayered substrate 23, the matching circuit defined by the transmission line 56 contained in the multilayered substrate 23. The signal propagated through the matching circuit is inputted to the SAW filter chip 41b via the via hole 57b, Rx input terminal 73b and such. The output signal from the SAW filter chip 41b is outputted to the Rx line 53 on the multilayered substrate 23 via the Rx output terminal 74b.

It is noted that FIG. 21 and FIG. 22 are schematic diagrams for illustrating one exemplary structure of the high-frequency module. Therefore, the positions of the Tx input terminal 73a, Tx output terminal 74a, Rx input terminal 73b, Rx output terminal 74b and such, and the layout of the via holes 57a, 57b, the matching circuit, the high-frequency power amplifier circuit 7 and such are not limited to the above but may arranged arbitrarily.

The aforesaid multilayered substrate 23 or substrate 54a, 54b comprises the dielectric substrate formed by laminating plural dielectric layers, and the interconnecting conductor layer formed of a conductive material and laid on the surface of the substrate or internally of the substrate.

Since the structures of the dielectric substrate and the interconnecting conductor layer and the manufacturing method thereof are basically the same as those described in the foregoing embodiments, the description thereof is dispensed with.

Although this embodiment is explained by way of the example where the matching circuit is defined by the transmission line, any other matching circuit is also usable, which include, for example, a matching circuit employing a chip component such as an inductor or capacitor mounted on the multilayered substrate 23, a matching circuit employing a inductor or a capacitor formed within the multilayered substrate 23, and the like. The circuit configuration, constant, pattern shape and the like of the matching circuit are all optional.

As shown in FIG. 21 through FIG. 23, this embodiment is constructed such that the Tx filter and the Rx filter are built separately. In contrast to the structures shown in FIG. 13 through FIG. 20 wherein the Tx filter and the Rx filter in the SAW filter package 40 are formed in a single chip on the same piezoelectric substrate, the structure of this embodiment is adapted to improve the isolation characteristics of these filters. In addition, the heat generated by the Tx filter is less transferred to the Rx filter, so that the Rx filter can exhibit more reliable characteristics.

Figure 24:
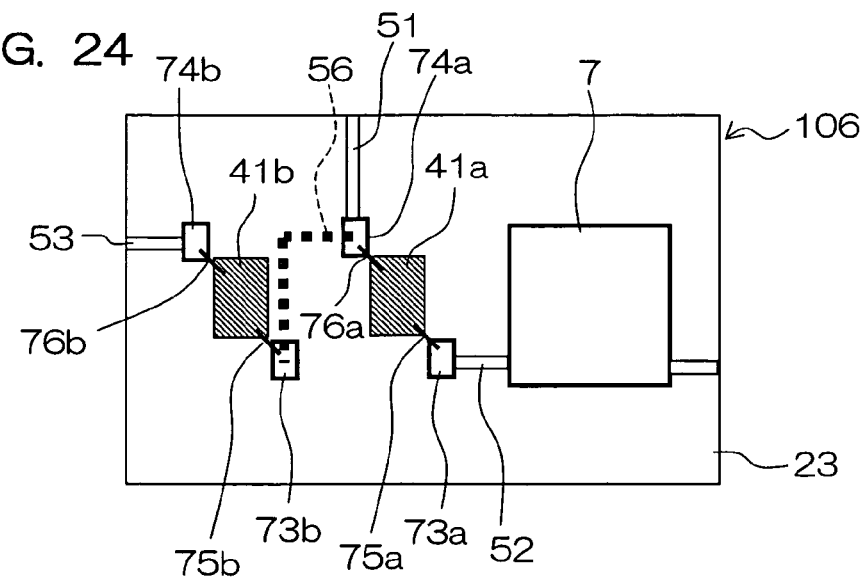
FIG. 24 is a schematic plan view showing a high-frequency module 106 having a SAW filter chip mounted directly on the substrate.
Figure 25:
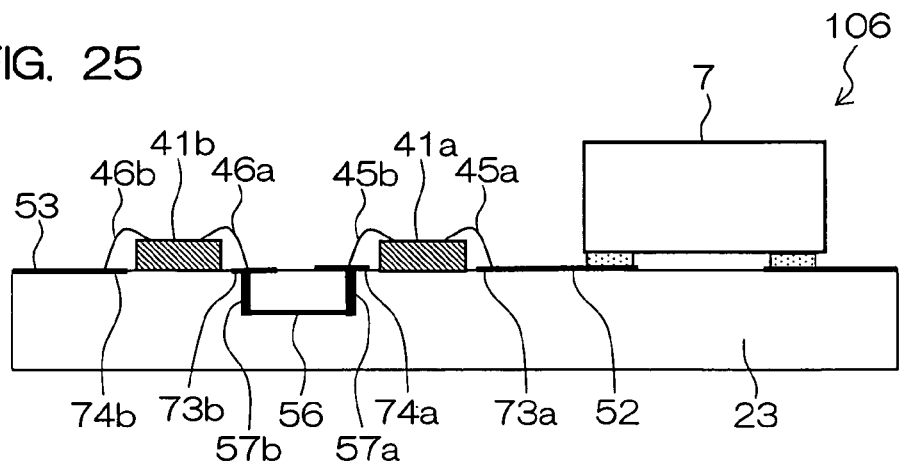
FIG. 25 is a sectional view showing the above high-frequency module 106.

FIG. 24 is a schematic plan view showing a high-frequency module 106 having another structure, whereas FIG. 25 is a sectional view thereof.

In contrast to the high-frequency module shown in FIG. 21 and FIG. 22, this module has a structure wherein the SAW filter chip as a single unit is bare chip packaged directly on the substrate rather than accommodated in the package. Specifically, the SAW filter chips 41a and 41b are directly mounted on the surface of the multilayered substrate 23, as shown in FIG. 24 and FIG. 25. The SAW filter chips 41a and 41b are electrically connected with the Tx input terminal 73a, the Tx output terminal 74a, the Rx input terminal 73b and the Rx output terminal 74b on the surface of the multilayered substrate 23 via bonding wires 45a, 45b, 46a, 46b, respectively.

With reference to FIG. 24 and FIG. 25, this embodiment illustrates the example where the bare chip packaging is implemented using the bonding wire. However, the bare chip packaging may adopt another mode such as flip-chip mounting.

Figure 26:
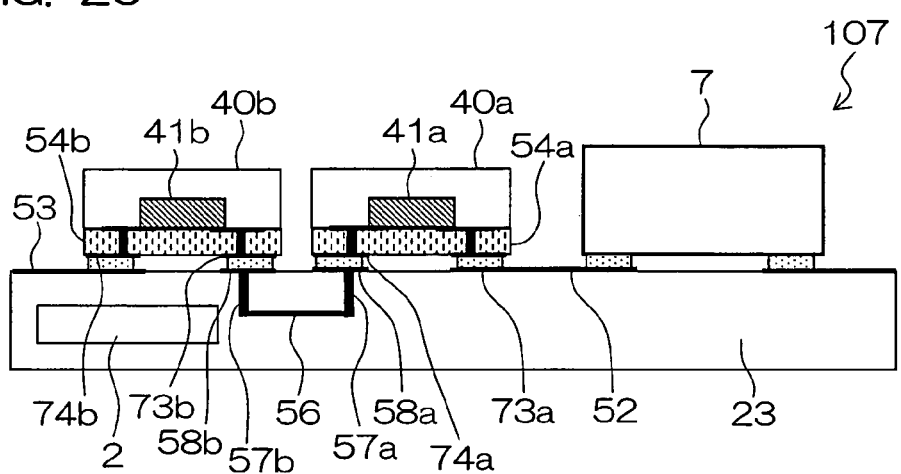
FIG. 26 is a schematic sectional view showing a high-frequency module 107 having the LC duplexer 2 contained in the multilayered substrate 23.
Figure 27:
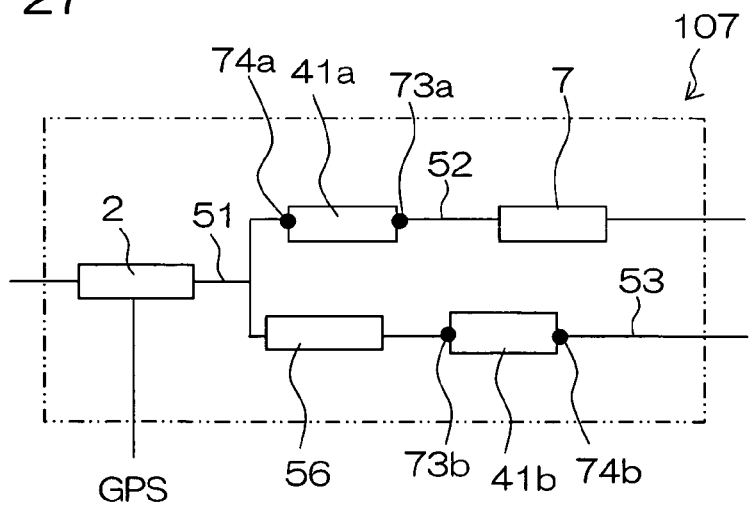
FIG. 27 is a block diagram showing a circuit configuration of the above high-frequency module 107.

FIG. 26 is a sectional view showing a high-frequency module 107 having still another structure. FIG. 27 is a block diagram showing a circuit configuration of the high-frequency module 107.

This embodiment differs from the high-frequency module 105 shown in FIG. 21 and FIG. 22 in that the LC duplexer 2 is added and contained in the multilayered substrate 23. Similarly to the LC duplexer 2 shown in FIG. 15, this LC duplexer 2 is responsible for demultiplexing the signal in the frequency band (e.g., 800 MHz) used for transmitting/receiving data or sound from the signal in the 1500 MHz band used for the reception of the GPS (Global Positioning System) signal for positional detection utilizing a satellite. For demultiplexing the GPS signal, the LC duplexer 2 has its input terminal connected with the antenna, and has another output terminal connected to the GPS circuit via the line.

According to the embodiment, the multilayered substrate 23 incorporates therein the LC duplexer 2, whereby a more sophisticated high-frequency module adapted for the GPS service may be realized in a compact body.

Figure 28:
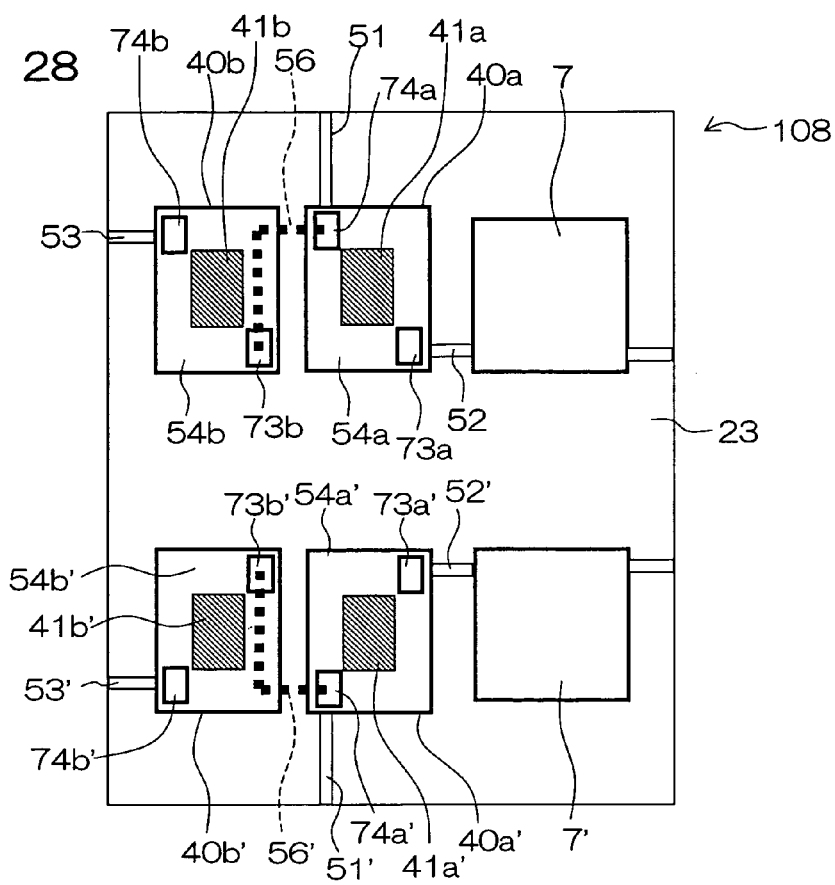
FIG. 28 is a block diagram showing a circuit configuration of a high-frequency module 108 corresponding to two bands.
Figure 29:
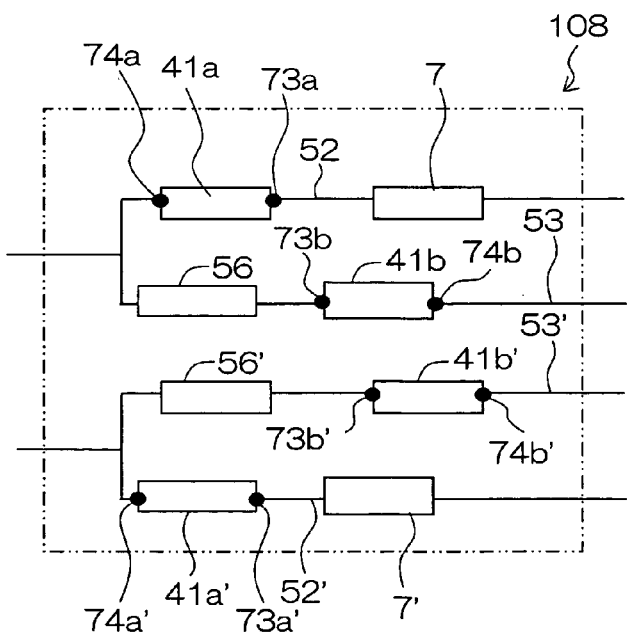
FIG. 29 is a block diagram showing a circuit configuration of the high-frequency module 108.

FIG. 28 is a schematic plan view showing a high-frequency module 108 having still another structure. FIG. 29 is a block diagram showing a circuit configuration of the high-frequency module 108.

A difference from the high-frequency module 105 shown in FIG. 21 through FIG. 23 consists in that additional SAW filter packages 40a' and 40b' handling a different frequency band and an additional high-frequency power amplifier circuit 7' are mounted on the same multilayered substrate 23. The SAW filter packages 40a and 40b and the high-frequency power amplifier circuit 7 correspond to the 800 MHz band, whereas the additional SAW filter packages 40a' and 40b' and high-frequency power amplifier circuit 7' correspond to the 1.9 GHz band.

The configuration of the added circuitry having the frequency band and the mounting structure thereof are the same as those described with reference to FIG. 21 through FIG. 23 and hence, the description thereof is dispensed with.

While FIG. 28 shows the devices of the two different frequency bands, the components thereof and the interconnecting conductors are arranged in plane symmetry or in a mirror-like fashion, the layout thereof is not limited to this.

Figure 30:
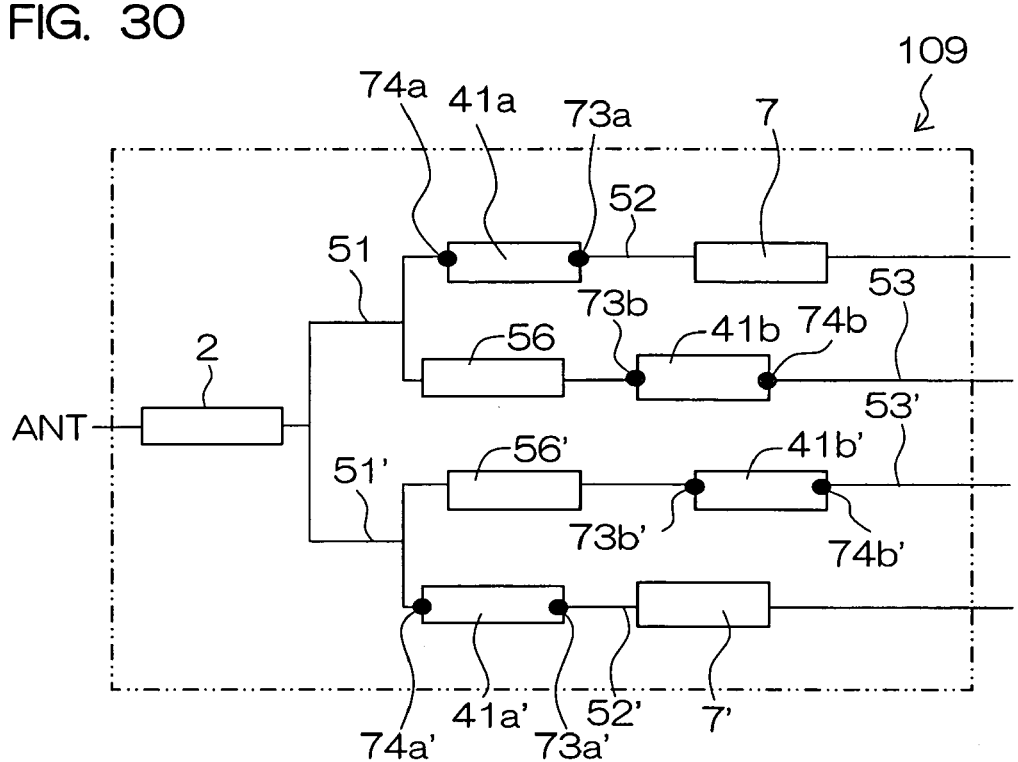
FIG. 30 is a block diagram showing a circuit configuration of a high-frequency module 109 having the LC duplexer 2 contained in the multilayered substrate.

FIG. 30 is a block diagram showing a circuit configuration of a high-frequency module 109 having still another structure.

The high-frequency module 109 is resemblant to the high-frequency module 108 shown in FIG. 28 and FIG. 29 in that the two SAW multiplexer circuits having different frequency bands and the high-frequency power amplifier circuit are mounted on the same multilayered substrate. However, the former module differs from the latter in that the multilayered substrate further contains therein the LC duplexer 2 for separating two frequency bands from each other. As shown in FIG. 30, the LC duplexer 2 is connected with the antenna at one end thereof, and is also connected with the lines 51 and 51' of the SAW multiplexer circuits at the other end thereof. A more sophisticated high-frequency module may be made compact by incorporating the LC duplexer 2 in the multilayered substrate.

It is also possible to realize a high-frequency module wherein the LC duplexer is replaced by a triplexer which has an additional output terminal connected with the GPS circuit. Thus is provided a compact high-frequency module which is capable of handling two channels and which also has the GPS function.

If any of the high-frequency modules 105 through 109 according to the aforementioned embodiments of the invention is used for forming the high-frequency signal processor circuit, there may be obtained a compact high-frequency signal processor integrated on the single multilayered substrate.

Figure 31:
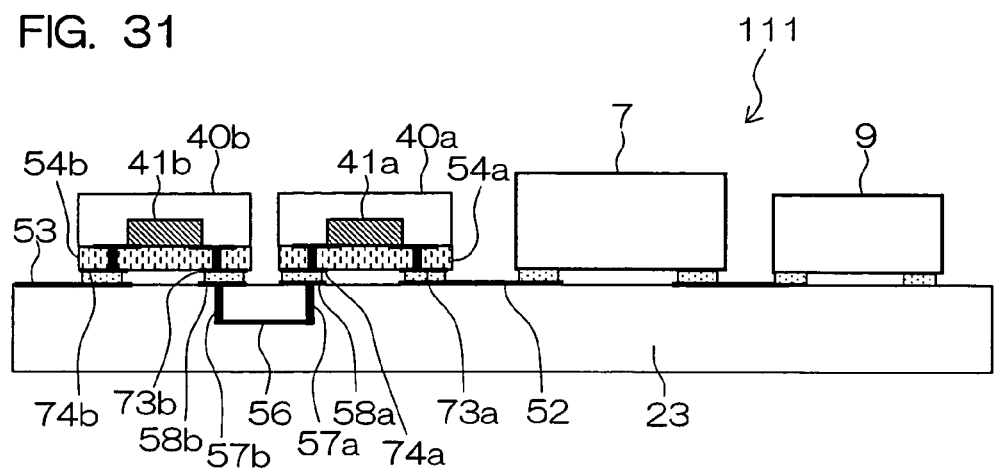
FIG. 31 is a sectional view showing an example where the bandpass SAW filter 9 is mounted on the high-frequency module having the configuration of FIG. 22.

FIG. 31 illustrates a high-frequency module 111 obtained by adding the band pass SAW filter 9 to the structure of the high-frequency module 105 of FIG. 22, the band pass filter 9 mounted on the multilayered substrate 23 and allowing the passage of the signal to be inputted to the high-frequency power amplifier circuit 7. While this example adds the band pass SAW filter 9 to the high-frequency module 105 of FIG. 22, the band pass SAW filter may be added to any of the high-frequency modules 106 to 109 shown in FIG. 24 to FIG. 30.

Figure 32:
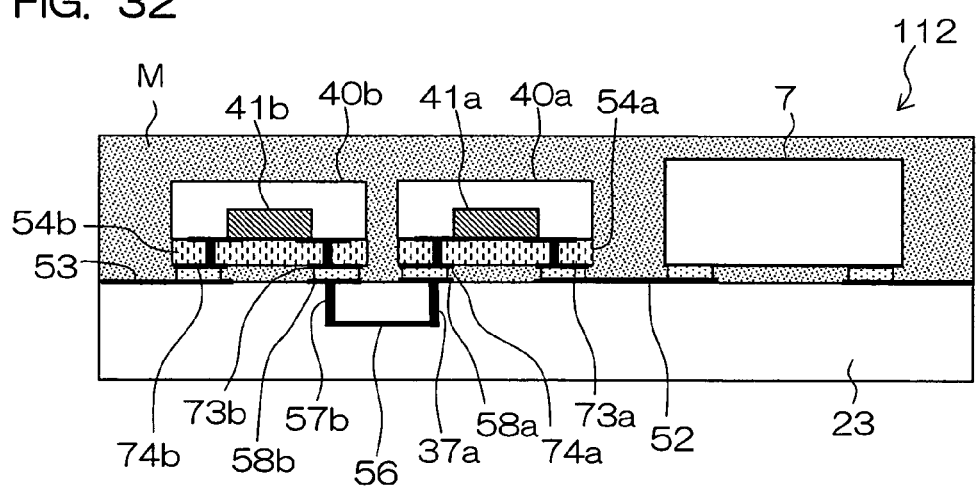
FIG. 32 is a sectional view showing the mold resin M overlaid on top of the multilayered substrate for covering up the mounted components.

It is preferred that after the individual components are mounted on the multilayered substrate 23, the whole body of the modules is resin molded. FIG. 32 is a sectional view showing a high-frequency module 112 wherein the mold resin M is overlaid on top of the multilayered substrate 23 for covering up the mounted components. The physical properties of the mold resin M will be described as below.

In a case where the SAW filter chip 41 along with the electronic components such as a capacitor, and other components such as a semiconductor device are mounted on the surface of the dielectric substrate 23, as shown in FIG. 8(a), FIG. 20 or FIG. 32, the solder 65 at the joint of the input/output electrode 43 where the SAW filter chip 41 is bonded to the dielectric substrate 23 and at the joint of the ground electrode 44 may sometimes be re-molten when the high-frequency module is secondarily mounted on a mother board MB by soldering or the like. The molten solder 65 may move toward the hermetic space 64, so that the hermetic space 64 in the SAW filter chip 41 may suffer sealing failure or that the solder 65 may short the joint of the input/output electrode 43 with that of the ground electrode 44.

This phenomenon occurs as follows. When the solder 65 at the joints of the input/output electrode 43 and of the ground electrode 44 is re-molten, the pressure of the molten/expanded solder 65 acts inwardly of the hermetic space 64 so as to cause an inward flow of the solder 65 which causes shorts.

It may be contemplated, as a countermeasure against the phenomenon, to use a material having such a high melting point as not to be re-molten as the solder 65, or to interpose a dam member between the joint of the input/output electrode 43 and that of the ground electrode 44 in order to prevent the solder so molten from flowing into the hermetic space 64. However, if only the solder 65 for mounting the SAW filter chip 41 is changed or if a different kind of material such as the dam member is added, an increased number of manufacturing steps and an increased cost result.

In the embodiment, therefore, a elastic modulus of the mold resin M is set to an optimum value.

Specifically, the elastic modulus of the mold resin M is defined to range from 4 to 8 GPa at room temperatures and to range from 0.2 to 0.5 PGa at 220° C. The following advantage is obtained by limiting the elastic modulus to the above ranges. In a case where the high-frequency module is bonded to the mother board MB by reflow soldering, for example, even though the solder joint is re-molten and thermally expanded so as to produce stress directed from the solder joint toward its periphery, the stress may be reduced by the mold resin M covering the most part of the solder. Therefore, the solder is prevented from being forced into space between the SAW filter chip 41 and the dielectric substrate 23. Accordingly, if the solder joint of the SAW filter chip 41 of the high-frequency module is re-molten, the solder joint continues to stay at the initial position as prevented from moving to an unwanted place. Hence, the consequent shorts or sealing failure is obviated.

If, on the other hand, the mold resin M has a elastic modulus of less than 4 GPa at room temperatures, the mold resin fails to impart high mechanical strength to the module. If the mold resin M has a elastic modulus of more than 8 GPa at room temperatures, the resin applies an excessive load to the wire bonding so that the wire will break.

If the mold resin M has a elastic modulus of less than 0.2 GPa at 220° C., connection failure of the wire bonding is likely to occur. If the elastic modulus exceeds 0.5 GPa, the mold resin is incapable of absorbing the stress resulting from the thermal expansion of the solder. Accordingly, each time reflow heating is repeated, the molten solder may be spread as forced into a gap between the semiconductor chip, the SAW filter chip 41 or the chip component and the substrate, or into an interface between the semiconductor chip and the mold resin. As a result, the shorts or the sealing failure cannot be avoided.

It is particularly preferred that the elastic modulus is in the range of 5 to 8 GPa at room temperatures and in the range of 0.3 to 0.5 GPa at 220° C.

The mold resin M may preferably have a glass transition point of 100 to 150° C. This is because the resin having such a glass transition point is in a glass-like state at room temperatures, thus ensuring that the high-frequency module as a whole has a sufficient mechanical strength.

If the mold resin has a glass transition point of less than 100° C., the resin per se is in a rubber-like state or gel state at room temperatures, thus failing to impart the sufficient mechanical strength to the high-frequency module. Conversely, if the glass transition point exceeds 150° C., the mold resin has a high hardness but falls short in toughness. Hence, in a manufacturing step wherein a substrate for plural high-frequency modules is divided into product units by dicing or the like, the mold resin is susceptible to cracks, resulting in product failure.

The glass transition point and the elastic modulus of the above mold resin are controlled according to the type or the molecular weight of the thermosetting resin. Theses parameters of the mold resin may also be controlled by admixing an inorganic filler in the thermosetting resin. Furthermore, the addition of the inorganic filler also increases the thermal conductivity of the mold resin. This is effective to dissipate heat generated from the semiconductor devices, so that the thermal resistance thereof may be decreased.

It is also preferred that the mold resin has a linear expansion coefficient of 25 to $80 \times 10^{-6}$/° C. as determined at temperatures lower than the glass transition point thereof, and that the substrate has a thermal expansion coefficient of 8 to $15 \times 10^{-6}$/° C. at temperatures lower than the glass transition point. The reason is as follows. Although the linear expansion coefficient of the mold resin can be controlled to less than $25 \times 10^{-6}$/° C. by increasing the proportion of the inorganic filler, the elastic modulus of the mold resin, in turn, tends to increase. Conversely, if the linear expansion coefficient exceeds $80 \times 10^{-6}$/° C., the difference of the expansion coefficient between the module substrate or the semiconductor chip and the mold resin is increased so much that the mold resin is prone to separation. This may lead to the sealing failure or the shorts caused by the solder. If the thermal expansion coefficient of the module substrate is less than $8 \times 10^{-6}$/° C. or more than $18 \times 10^{-6}$/° C., the difference of the thermal expansion coefficient between the SAW filter chip 41 and the module substrate is increased so much that the ground electrode surrounding the IDT electrodes and the joints of the input/output electrodes are more susceptible to cracks. This leads to a lowered reliability of the module.

According to the invention, what is needed is to seal at least the SAW filter chip 41 with the aforesaid mold resin M. However, it is preferred to collectively seal the surface mounted components (the capacitor, the resistor component, the semiconductor devices 24, 25, an FBR (Film Bulk Acoustic Resonator), MEMs switches, an optical semiconductor device and such) using the mold resin M, the surface mounted components formed on the surface of the dielectric substrate 23. In this manner, the hermetic sealing of the joints between the individual components and the dielectric substrate 23 and of the SAW filter chip 41 may be notably increased in reliability.

Next, description is made on the temperature characteristics of a high-frequency module 110 comprising a single package incorporating therein the power amplification semiconductor device of the high-frequency power amplifier circuit 7, the band pass SAW filter, the receiving SAW filter and the transmitting SAW filter.

The high-density packaging involves a fear that heat from the transmission power amplifier device raises the temperature of the other components while the raised temperature may affect the electrical characteristics of the components and may also lower the speech quality of the portable radio terminal.

The SAW filter has a temperature characteristic that when increased in temperature by the heat from the transmission power amplifier device, the SAW filter is lowered in frequency.

The difference of frequency characteristics of the SAW filter between the operation time of the transmission power amplifier (heat generation time) and the non-operation time thereof (non-heat-generation time) is described as below. The SAW filter has such a frequency characteristic as to have lower frequencies at heat generation time than at non-heat-generation time.

Therefore, the invention has an object to ensure the performances of the operating high-frequency amplifier circuit including the transmission power amplifier device by adjusting the frequency characteristic of the SAW filter based on estimated temperature increase.

The invention has another object to ensure the temperature performance of a radio communication apparatus incorporating the high-frequency amplifier circuit.

The following description is made on a structure of the high-frequency module 110 comprising a single package incorporating therein the power amplification semiconductor device 24 constituting the cellular system (800 MHz band), the band pass SAW filter 9, the receiving SAW filter 4b and the transmitting SAW filter 4a. However, a high-frequency module comprising a single package incorporating therein the power amplification semiconductor device 25 constituting the PCS system (1.9 GHz band), the band pass SAW filter 10, the receiving SAW filter 3b and the transmitting SAW filter 3a may have the same structure.

In an alternative structure, a single package may incorporate therein the power amplification semiconductor devices individually constituting the cellular system (800 MHz band) and the PCS system (1.9 GHz band), the band pass SAW filter, the receiving SAW filter and the transmitting SAW filter. In this case, two power amplification devices are mounted on the high-frequency module and hence, two heat sources exist. This dictates the need to design the frequency band of the SAW filter based on the temperature increase associated with the two heat sources.

Figure 33A:
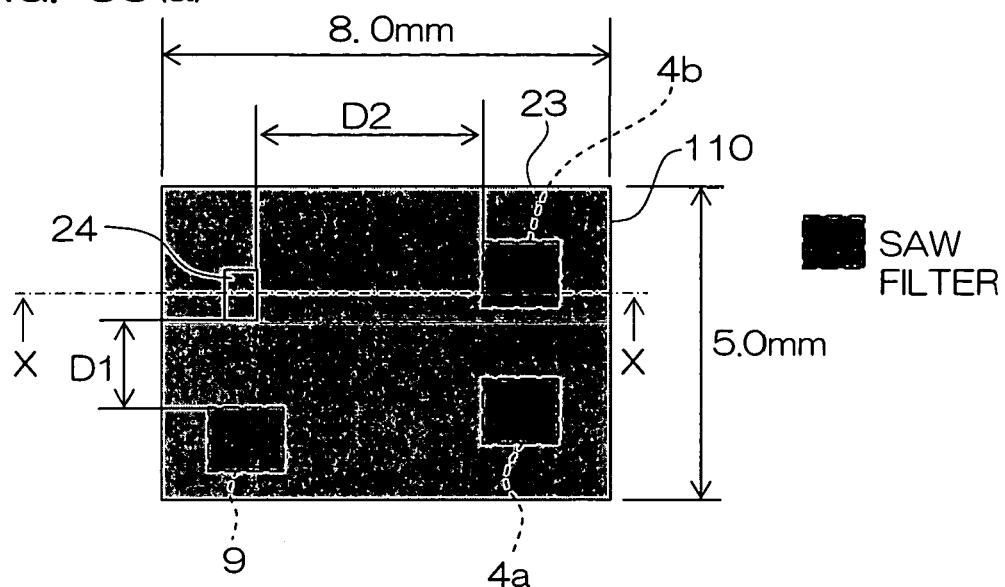
FIG. 33(a) is a plan view showing a high-frequency module on which a high-frequency amplifier circuit and a SAW filter are mounted.
Figure 33B:
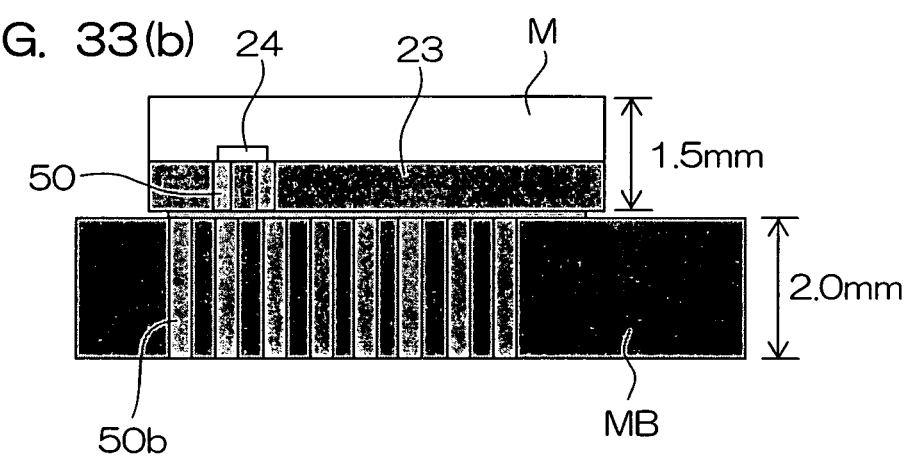
FIG. 33(b) is a sectional view taken on the line X-X in FIG. 33(a)

FIG. 33(a) is a plan view showing the high-frequency module 110 according to the invention, whereas FIG. 33(b) is a sectional view taken on the line X-X in FIG. 33(a).

The high-frequency module 110 has a structure wherein the power amplification semiconductor device 24, the band pass SAW filter 9, the receiving SAW filter 4b and the transmitting SAW filter 4a are arranged on a front or back side of the dielectric substrate 23. The dielectric substrate 23 contains therein the directional coupler 5, the matching circuit 4c and the like. In addition, an upper part of the dielectric substrate is protected with the molded resin M.

Each of the band pass SAW filter 9, the receiving SAW filter 4b and the transmitting SAW filter 4a may be packaged and mounted on the surface of the dielectric substrate 23. Otherwise, each of the above components may be in the form of a bare chip to be mounted directly on the surface of the dielectric substrate 23.

As to the positional relation among the power amplification semiconductor device 24, the band pass SAW filter 9, the receiving SAW filter 4b and the transmitting SAW filter 4a, FIG. 33 shows the power amplification semiconductor device 24 and the transmitting SAW filter 4a located on a diagonal. However, the placement of these components should be decided in the interest of the signal propatation path. That is, the invention is not limited to this placement but may take another pattern.

The whole body of the high-frequency module 110 is mounted on the mother board MB of the radio communication apparatus such as a portable radio terminal.

As mentioned supra, the dielectric substrate 23 has the structure comprising the lamination of plural dielectric layers.

As shown in FIG. 33, the dielectric substrate 23 is formed with the thermal via 50 under place where the power amplification semiconductor device 24 is mounted, in order to release heat generated from the power amplification semiconductor device 24. The thermal via 50 is a via-hole conductor extended through the dielectric substrate 23 from top to bottom. For attaining a function to transfer heat, the thermal via is so formed as to have a particularly large sectional area.

Furthermore, the mother board MB is also formed with thermal vias 50b for releasing the heat to a case (not shown), the thermal via extended through the board.

To illustrate the dimensions, the dielectric substrate 23 is a 5 mm×8 mm square and has a thickness of 1.5 mm inclusive of the mold resin M. The mother board MB has a thickness of 2 mm. It is noted that these dimensions are a mere illustrative example and it goes without saying that the invention is not limited to these numerals.

Assume that "D1" represents a distance between the power amplification semiconductor device 24 and the band pass SAW filter 9, and that "D2" represents a distance between the power amplification semiconductor device 24 and the receiving SAW filter 4b.

Figure 34:
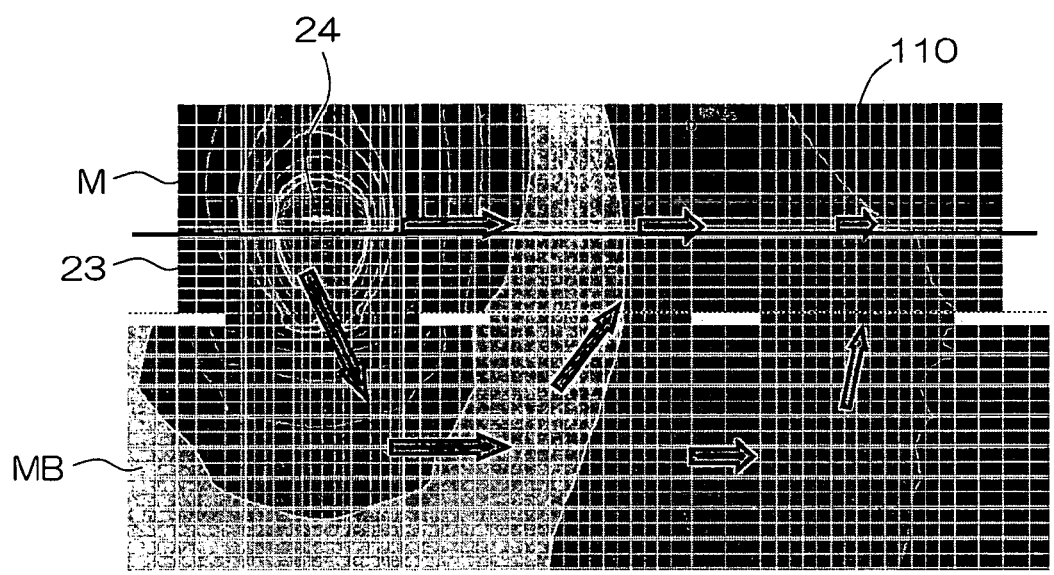
FIG. 34 is a sectional view showing temperature distribution on a dielectric substrate in a case where a high-frequency module is mounted on a mother board.

FIG. 34 is a sectional view showing a simulated temperature distribution model on the mother board MB and on the dielectric substrate 23 of the high-frequency module 110 mounted thereon.

It is assumed that the dielectric substrate 23 employs, as its material, glass ceramics having a higher heat conductivity than a glass epoxy resin. The arrows in FIG. 34 indicate the directions of heat transfer, showing that when the heat is generated from the power amplification semiconductor device 24, the heat is radially transferred through the high-frequency module 110 and the mother board.

The heat generated from the power amplification semiconductor device 24 is partially transferred to the mother board MB via the thermal via 50. The heat not transferred to the mother board MB, on the other hand, is transferred on the glass-ceramics dielectric substrate 23 to reach the band pass SAW filter 9, the receiving SAW filter 4b and the transmitting SAW filter 4a. Hence, the temperatures of the SAW filters become higher than the ambient temperature.

In a state where the high-frequency module 110 was mounted on the mother board MB which was accommodated in a casing of the portable radio terminal, the high-frequency amplifier circuit was operated while measurement was taken on the temperature at the top surface of the dielectric substrate. The measurement results are shown in FIG. 35.

Figure 35:
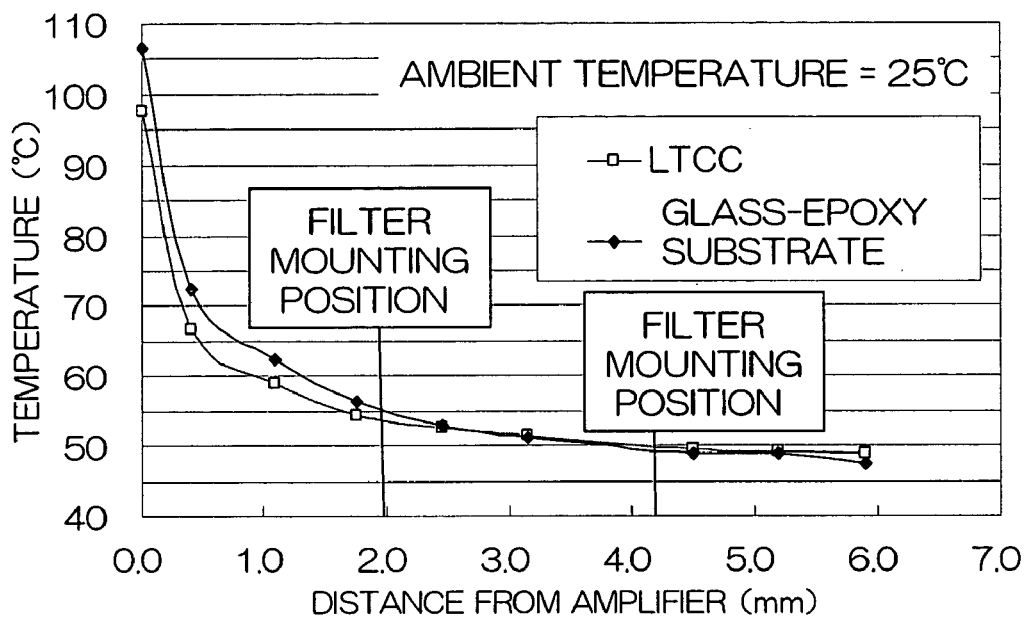
FIG. 35 is a graph showing the relation between the temperature and the distance from a power amplifier device, the temperature taken at an upper surface of a dielectric substrate of a high-frequency module operated as mounted on a mother board, which is accommodated in casing of a portable radio terminal.

In FIG. 35, the abscissa is the distance from the power amplification semiconductor device 24 and the ordinate is the temperature on the dielectric substrate 23. The hollow squares represent the temperature distribution of the glass-ceramics dielectric substrate whereas the solid dots represent the temperature distribution of the glass-epoxy dielectric substrate. The room temperature was at 25° C. As shown in the figure, there occur some differences in the relation between the temperature and the distance depending upon the substrate materials.

The temperature at the top surface of the power amplification semiconductor device 24 is 98° C. where it is formed on the glass-ceramics dielectric substrate, and is 107° C. where it is formed on the glass-epoxy dielectric substrate. In a case where a distance D1 between the power amplification semiconductor device 24 and the SAW filter is 2 mm, the SAW filter exhibits a surface temperature of about 55° C. In a case where a distance D2 between the power amplification semiconductor device 24 and the SAW filter is 4 mm, the SAW filter exhibits a surface temperature of about 50° C. Accordingly, a temperature increase $\Delta T$ from the room temperature (25° C.) is +30° C. in the case of D1=2 mm. In the case of D2=4 mm, a temperature increase $\Delta T$ from the room temperature is +25° C.

The mounting position of the SAW filter may be decided based on this graph, so as to permit the calculation of the temperature increase $\Delta T$(° C.) during the actual operation of the filter. If consideration is given to avoiding a sharp temperature increase $\Delta T$, it may be judged that the distance D1, D2 from the power amplification device must be at least 1 mm or preferably be at least 2 mm.

Next, description is made on an exemplary design of the pass band of the SAW filter.

It is assumed that the required operating environment temperature of the portable radio terminal is in the range of $-20°$ C. to 60° C.

If the SAW filter is positioned at a distance D of 4 mm from the power amplification device provided that the power amplification device and the SAW filter are mounted on the glass-epoxy substrate, the temperature of the SAW filter is raised to 50° C. as described above and hence, the temperature increase $\Delta T$ from the room temperature (25° C.) is $\Delta T$=25° C.

Next, assume that the temperature coefficient for the frequency change rate of the SAW filter is represented by k(ppm/° C.). The frequency change rate associated with the temperature fluctuations $\Delta f/f$(ppm) can be determined from the following equation and from the slope of the graph shown in FIG. 38:

$$\Delta f/f = k \cdot \Delta T.$$

Figure 38:
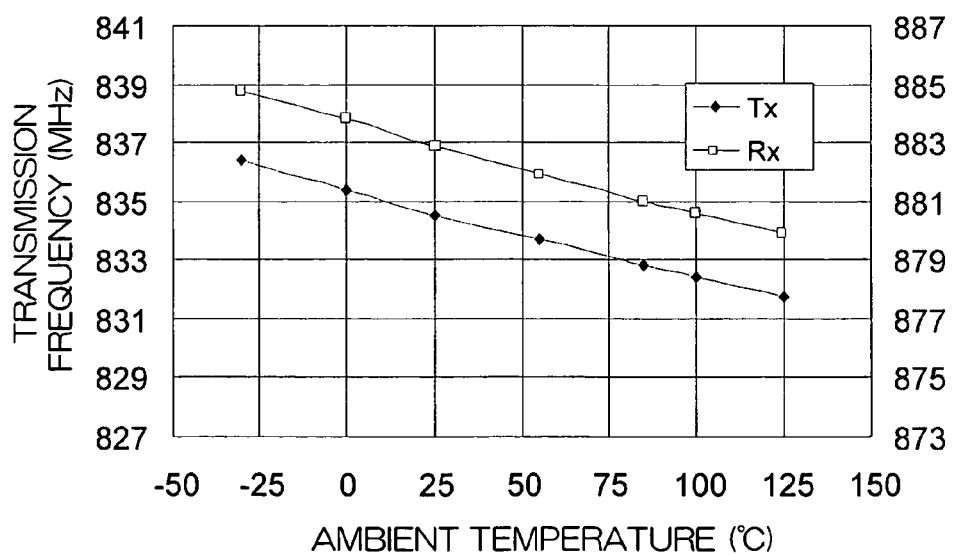
FIG. 38 is a graph showing the relation between a frequency-temperature characteristic of a SAW filter.
Figure 39:
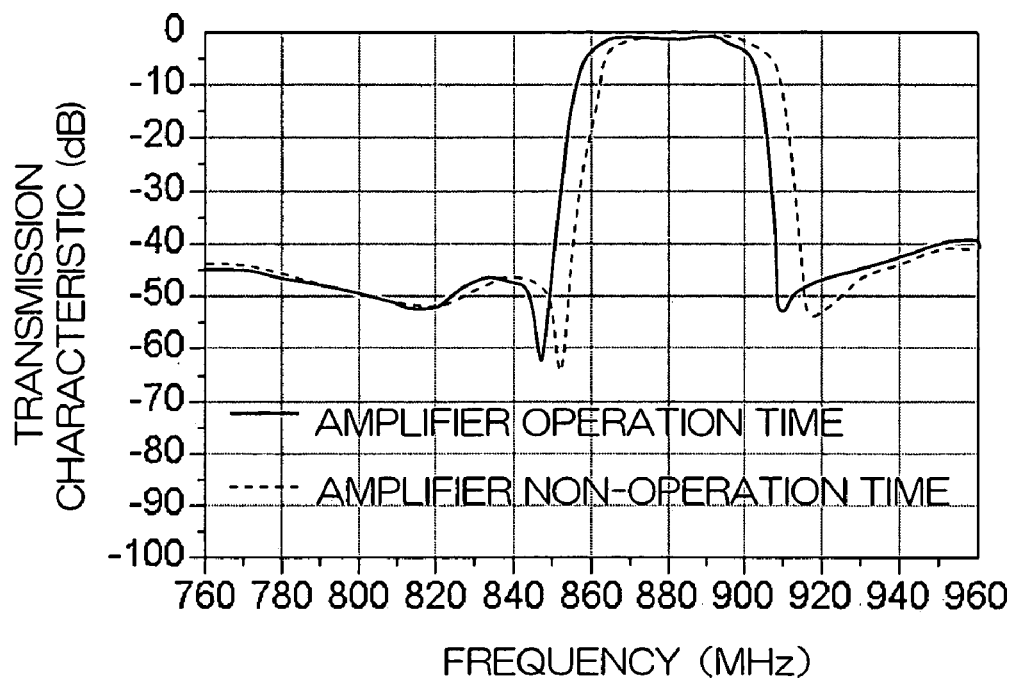
FIG. 39 is a graph showing a difference of frequency characteristics of a SAW filter between operation time of a transmission power amplifier (heat generation time) and non-operation time thereof (non-heat-generation time)

Specifically, the characteristic of the frequency change rate versus the temperature of the SAW filter is k=−36 ppm/° C. as determined from the slope of FIG. 38. Thus, a frequency change rate $\Delta f/f$ corresponding to $\Delta T$=25° C. is $\Delta f/f$=−36×25=−900 ppm.

Figure 36:
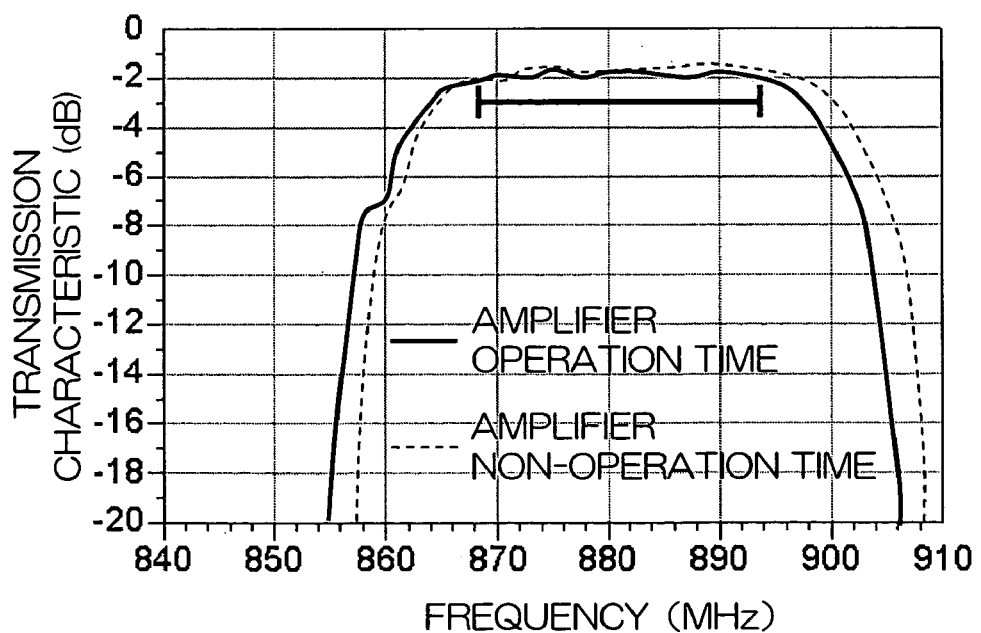
FIG. 36 is a graphical representation of a frequency characteristic of a SAW filter for explaining an exemplary design of a passband of the SAW filter.

In a case where the SAW filter is an antenna demultiplexing receiving SAW filter 4b for use in a portable terminal of the CDMA system, a required pass band of the filter is in the range of 869 to 894 MHz, as shown in FIG. 36.

Given the temperature increase $\Delta T$, therefore, a design value of the pass band of the SAW filter is defined to range from 869.0 to 894.8 MHz by increasing a higher end value of the band by 900 ppm (0.8 MHz). Since the temperature coefficient k of the SAW filter takes a negative value, the band is broadened only on the high-frequency side while the band is unchanged on the low-frequency side. Thus, a center frequency of the pass band is at 881.9 MHz, which is 0.4 MHz higher than 881.5 MHz.

In a case where the SAW filter is mounted on place 2.0 mm from the power amplification device, $\Delta T$=30° C. and a frequency change rate $\Delta f/f$=−1080 ppm. Hence, a design value of the antenna demultiplexing receiving SAW filter is defined to range from 869.0 to 895.0 MHz (894×1.00108=895.0).

Figure 37:
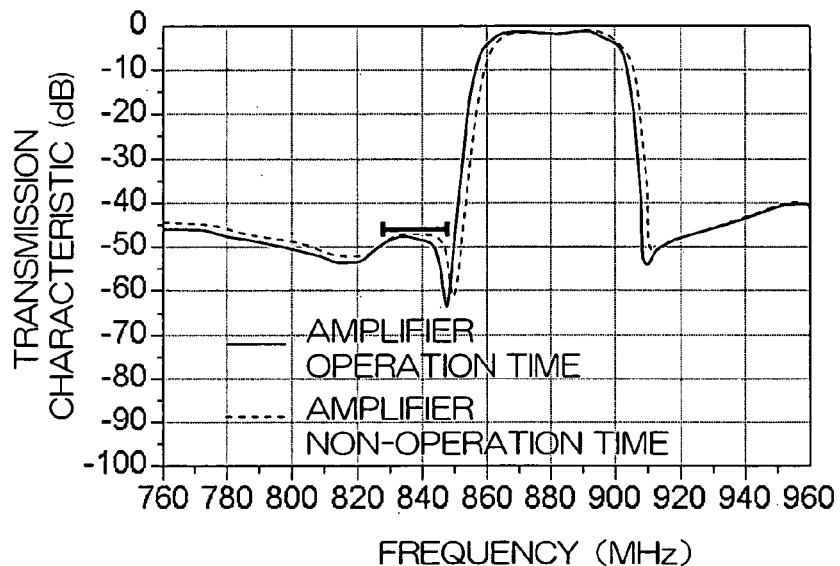
FIG. 37 is a graphical representation a frequency characteristic of a SAW filter for explaining an exemplary design of a stop band of the SAW filter.

FIG. 37 shows an exemplary design of a stop band of the SAW filter. In a case where the SAW filter is the antenna demultiplexing receiving SAW filter 4b for use in the portable terminal of the CDMA system, a required stop band thereof is in the range of 824 to 849 MHz. Likewise to the above example, therefore, a design value of the stop band may be defined to range from 824.0 to 849.8 MHz by increasing only the upper end of the stop band by 900 ppm.

The practice of the invention is not limited to the foregoing embodiments. For instance, the high-frequency modules mentioned above assume a CDMA terminal including the US cellular band and PCS band. However, the high-frequency module of the invention may be an IMT-2000 W-CDMA terminal, a GSM (Global System for Mobile communications) or DCS (Digital Cellular System) terminal in Europe, a Bluetooth having a 2.4 GHz band, or a front end such as of W-LAN. The aforesaid SAW filter may comprise a FBAR (Film Bulk Acoustic Resonator) filter.

EXAMPLES

Next, description is made on examples of the high-frequency module fabricated according to the invention.

A slurry was prepared using a ceramic powder composition obtained by admixing 10 mass parts of B on a $B_2O_3$ basis and 5 mass parts of Li on a $LiCO_3$ basis to 100 mass parts of main component represented by 0.95-mol $MgTiO_3$-0.05-mol $CatiO_3$. The resultant slurry was doctor bladed to form a green sheet having a thickness of 100 μm.

Next, an Ag paste was screen printed on a surface of the green sheet, so as to form a conductor pattern having a thickness of 20 μm. As required, a through-hole having a diameter of 200μ was formed in the green sheet and was filled with the aforesaid Ag paste so as to form a through-hole conductor. Thereafter, the resultant green sheets were laminated and were subjected to a binder removal process wherein the laminate was heated at 300° C. in the atmosphere for 4 hours. Subsequently, the laminate was sintered at 900° C. in the atmosphere for 6 hours. Thus was obtained a module substrate having a thermal expansion coefficient of $12 \times 10^{-6}/°$ C.

Next, an electrode film comprising an Al—Cu (2 wt %) alloy was formed on a piezoelectric substrate (lithium tantalite monocrystal having 42° Y-cut and a thermal expansion coefficient of 14 to $16 \times 10^{-6}/°$ C.). Thereafter, an excitation electrode, input/output electrodes, a ground electrode and a protective film were formed by repeating resist application, patterning, and resist separation. Thus was fabricated the SAW filter chip 41.

The resultant SAW filter chip 41 was face-down mounted on the module substrate according to FIG. 7 and FIG. 8. The mounting was accomplished by applying a high-temperature solder to the ground electrode and the input/output electrodes by screen printing followed by solder reflowing. According to the mounting structure of the SAW filter chip 41, the ground electrode surrounded the IDT electrodes, thereby accomplishing the hermetic sealing before the filter was sealed with a resin.

Subsequently, the solder was applied in each mounting pattern using a dispenser. Thereafter, chip components such as a capacitor chip were mounted and the solder was fixed to places by reflowing. Finally, a semiconductor chip was bonded to the substrate using a silver paste and then wire bonded using a gold wire.

A high-frequency module mounting thereon a variety of surface-mounted components, the semiconductor chip and the SAW filter chip 41 was fabricated by the aforementioned method.

placed in water, the modules were evaluated for the electrical characteristics thereof, so as to check for the hermetic sealing of the filters and the power amplifier. The modules were evaluated according to the following criteria. A module free from a defective mode including the short, the cracks and the hermetic sealing failure is represented by o, whereas a module suffering the above defective mode is represented by x. Additionally, Table 1 also lists the incidence (%) of the defective mode in a column of the evaluation of the reflow process following the moisture removal process.

TABLE 1

| Sample No. | Resin | FM (GPa) Normal | FM (GPa) 220° C. | GTP (° C.) | Substrate TEC ×10⁻⁶/° C. | Resin LEC ×10⁻⁶/° C. | Defect incidence After MR/Reflow (%) | Defective mode |
|---|---|---|---|---|---|---|---|---|
| 1 | A | 5.9 | 0.4 | 110 | 12 | 25 | 0 | — |
| 2 | B | 7.3 | 0.35 | 110 | 12 | 43 | 0 | — |
| 3 | C | 6.5 | 0.4 | 143 | 12 | 33 | 0 | — |
| 4 | B | 7.3 | 0.35 | 110 | 8.5 | 25 | 0 | — |
| *5 | D | 13 | 0.65 | 140 | 12 | 15 | 30 | Short |
| 6 | D | 13 | 0.65 | 140 | 6 | 35 | 80 | LHS, SAW chip damage |
| *7 | E | 0.5 | 0.2 | 75 | 12 | 90 | 75 | IS |
| *8 | F | 33 | 0.8 | 146 | 12 | 3 | 60 | Short, LHS |
| 9 | A | 5.9 | 0.4 | 110 | 20 | 25 | 20 | LHS |
| *10 | F | 33 | 0.8 | 146 | 23 | 80 | 75 | LHS |
| 11 | C | 6.5 | 0.4 | 143 | 19 | 33 | 10 | LHS |

Note:
*indicates a sample out of the scope of the invention
FM: Flexural Modulus, GTP: Glass Transition Point, TEC: Thermal Expansion Coefficient, LEC: Linear Expansion Coefficient, MT: Moisture Removal, LHS: Lowered Hermetic Sealing, IS: Interfacial Separation Next, there were prepared mold resins A, B, C, D, E and F which each had different properties and included molten silica, as a filler, admixed to an epoxy resin. The elastic modulus of each mold resin was determined according to JIS-K-6911, whereas the glass transition point and the linear expansion coefficient thereof were determined using a dilatometer.

A glass-ceramics substrate formed with 80 high-frequency module regions was sealed with each of the aforesaid mold resins in one operation, wherein the mold resin was applied to the substrate by printing using a metal mask and a squeezing roller, so as to cover the plural module regions 158a at a time. Subsequently, the mold resin thus patterned by the printing was cured by baking. Then, a dicing machine was operated to separate the 80 high-frequency module regions from one another. Thus were obtained discrete high-frequency modules.

Furthermore, commercially available glass-ceramics substrates having respective thermal expansion coefficients of 6, 8.5×10⁻⁶/° C.; commercially available glass-ceramics substrates having respective thermal expansion coefficients of 20, 25, 88×10⁻⁶/° C.; and commercially available module substrates of glass fiber-epoxy composite materials having respective thermal expansion coefficients of 19, 20, 23×10⁻⁶/° C. were also used as module substrates having different thermal expansion coefficients.

Subsequently, the sealed high-frequency modules were allowed to stand for 168 hours in an atmosphere having a temperature of 85° C. and a moisture of 60%, so as to be removed of moisture therefrom. The moisture removal was followed by reflow heating (peak temperature of 260° C.) which was repeated in 3 cycles. Thereafter, the modules were subjected to an appearance inspection for checking for cracks and to a continuity test for checking for short. After As shown in Table 1, the modules of the above examples all have a short and crack incidence of 0%. It is thus confirmed that these modules are free from the defective mode.

In contrast, all of the samples having the elastic moduli and the thermal expansion coefficients deviated from the scope of the invention are incapable of fully accommodating the stress caused by the thermally expanded solder and hence, the short, the interfacial separation and the degraded hermetic sealing are observed.

The invention claimed is:

1. A high-frequency module comprising:
   a transmitting filter and a receiving filter connected with an antenna terminal directly or via a multiplexer circuit;
   a matching circuit inserted in an input side of the receiving filter; and
   a high-frequency power amplifier circuit connected with the transmitting filter for amplifying a transmission signal in a predetermined transmission pass band, the filters, the matching circuit and the high-frequency power amplifier circuit provided on a multilayered substrate,
   wherein the transmitting filter and the receiving filter is a surface acoustic wave (hereinafter, referred to as "SAW") filter,
   wherein the transmitting SAW filter and the receiving SAW filter constitute a single bare chip formed on a single piezoelectric substrate,
   wherein a main surface of the bare chip is formed with IDT electrodes, input/output electrodes of the IDT electrodes, and a ground electrode surrounding the IDT electrodes, wherein the ground electrode and the input/output electrodes are bonded with electrodes formed on the surface of the multilayered substrate in a face-to-face relation, wherein a sealed space is formed at a SAW propagation portion of the IDT electrodes.

2. A high-frequency module according to claim 1, wherein the matching circuit is inserted between an input terminal of the receiving filter and an output terminal of the transmitting filter.

3. A high-frequency module according to claim 1, wherein a passive device constituting a part of the matching circuit is formed at a dielectric layer within the multilayered substrate.

4. A high-frequency module according to claim 3, wherein the matching circuit includes a transmission line formed at the dielectric layer within the multilayered substrate.

5. A high-frequency module according to claim 4, wherein the matching circuit further includes a chip component of an inductor device and/or a capacitor device, the chip component disposed on a surface of the multilayered substrate.

6. A high-frequency module according to claim 4, wherein the matching circuit further includes an inductor device and/or a capacitor device formed at the dielectric layer within the multilayered substrate.

7. A high-frequency module according to claim 1, wherein the multilayered substrate is a multilayered ceramic substrate including ceramic dielectric layers.

8. A communication apparatus, such as a portable terminal, which incorporates therein the high-frequency module according to claim 1.

9. A high-frequency module according to claim 1, wherein the ground electrode and the input/output electrodes of the bare chip are bonded with the electrodes on the surface of the multilayered substrate by means of solder.

10. A high-frequency module according to claim 1, wherein the multilayered substrate is formed with a cavity, in which the bare chip is mounted.

11. A high-frequency module according to claim 1, wherein the bare chip is provided on a back side of the multilayered substrate.

12. A high-frequency module according to claim 1, wherein a frequency characteristic of each of the SAW filters is set to a higher level than a required design value according to an estimated temperature increase of each of the SAW filters associated with heat generated from a transmission power amplifier device constituting a part of the high-frequency power amplifier circuit.

13. A high-frequency module according to claim 12, wherein the frequency characteristic of the SAW filter is a pass band characteristic of the SAW filter, and the higher end of the pass band is set to a higher level than the required design value.

14. A high-frequency module according to claim 12, wherein the frequency characteristic of the SAW filter is a stop band characteristic of the SAW filter, and the higher end of the stop band is set to a higher level than the required design value.

15. A high-frequency module according to claim 12, wherein the temperature increase of the SAW filter associated with the generated heat is estimated according to a distance from the transmission power amplifier device.

16. A high-frequency module according to claim 12, wherein the temperature increase of each SAW filter associated with the generated heat is estimated according to each distance from the transmission power amplifier device.

17. A high-frequency module according to claim 1, wherein the components mounted on the multilayered substrate are hermetically sealed with a mold resin.

18. A high-frequency module according to claim 17, wherein the mold resin is a thermosetting resin having properties which include: an elastic modulus of 4 to 8 GPa at room temperatures, an elastic modulus of 0.2 to 0.5 GPa at 220° C., and a glass transition point of 100 to 150° C.

19. A high-frequency module according to claim 18, wherein a linear expansion coefficient of the thermosetting resin at temperatures lower than the glass transition point is in the range of 25 to $80 \times 10^{-6}$/° C.

20. A high-frequency module according to claim 1, wherein the multilayered substrate has a linear expansion coefficient of 8 to $18 \times 10^{-6}$/° C. at 25 to 400° C.

21. A high-frequency module according to claim 1, wherein a passive device constituting a part of the multiplexer circuit is formed at a dielectric layer within the multilayered substrate.

22. A high-frequency module comprising:
a transmitting filter and a receiving filter connected with an antenna terminal directly or via a demultiplexer circuit;
a matching circuit inserted in an input side of the receiving filter; and
a high-frequency power amplifier circuit connected with the transmitting filter for amplifying a transmission signal in a predetermined transmission pass band, the filters, the matching circuit and the high-frequency power amplifier circuit mounted on a multilayered substrate,
wherein the transmitting filter and the receiving filter is a surface acoustic wave (hereinafter, referred to as "SAW") filter,
wherein the transmitting SAW filter and the receiving SAW filter constitute a single bare chip formed on a single piezoelectric substrate,
wherein a main surface of the bare chip is formed with IDT electrodes, input/output electrodes of the IDT electrodes, and a ground electrode surrounding the IDT electrodes,
wherein the ground electrode and the input/output electrodes are bonded with electrodes formed on the surface of a substrate different from the multilayered substrate, in a face-to-face relation, thereby forming a SAW package,
wherein a sealed space is formed at a SAW propagation portion of the IDT electrodes, and
wherein the SAW package is mounted on the multilayered substrate.

23. A high-frequency module comprising:
a transmitting filter and a receiving filter (hereinafter, referred to as "SAW" filter) connected with an antenna terminal directly or via a multiplexer circuit;
a matching circuit inserted in an input side of the receiving filter; and
a high-frequency power amplifier circuit connected with the transmitting filter for amplifying a transmission signal in a predetermined transmission pass band, the filters, the matching circuit and the high-frequency power amplifier circuit provided on a multilayered substrate,
wherein the SAW filter comprises a bare chip,
wherein a main surface of the bare chip is formed with IDT electrodes, input/output electrodes of the IDT electrodes, and a ground electrode surrounding the IDT electrodes, wherein the ground electrode and the input/output electrodes are bonded with electrodes formed on the surface of the multilayered substrate in a face-to-face relation, wherein a sealed space is formed at a SAW propagation portion of the IDT electrodes, wherein the components provided on the multilayered substrate are sealed with a mold resin, and wherein the mold resin is a thermosetting resin having properties which include: an elastic modulus of 4 to 8 GPa at room temperatures, an elastic modulus of 0.2 to 0.5 GPa at 220° C., and a glass transition point of 100 to 150° C.

24. A high-frequency module according to claim 23, wherein the multilayered substrate has a linear expansion coefficient of 8 to $18 \times 10^{-6}$/° C. at 25 to 400° C.

25. A high-frequency module according to claim 23, wherein the linear expansion coefficient of the thermosetting resin at temperatures lower than the glass transition point is in the range of 25 to $80 \times 10^{-6}$/° C.

26. A communication apparatus, such as a portable terminal, which incorporates therein the high-frequency module according to claim 23.

27. A high-frequency module comprising a transmission power amplifier device and a SAW filter provided on a dielectric substrate, wherein a frequency characteristic of the SAW filter is set to a higher level than a required design value according to an estimated temperature increase of the SAW filter associated with heat generated from the transmission power amplifier device.

28. A high-frequency module according to claim 27, wherein the frequency characteristic of the SAW filter is a pass band characteristic of the SAW filter and the higher end of the pass band is set to a higher level than the required design value.

29. A high-frequency module according to claim 27, wherein the frequency characteristic of the SAW filter is a stop band characteristic of the SAW filter and the higher end of the stop band is set to a higher level than the required design value.

30. A high-frequency module according to claim 27, wherein the temperature increase of the SAW filter associated with the generated heat is estimated according to a distance from the transmission power amplifier device.

31. A high-frequency module according to claim 27, wherein plural SAW filters are provided on the dielectric substrate, and the temperature increase of each SAW filter associated with the generated heat is estimated according to each distance from the transmission power amplifier device.

32. A communication apparatus, such as a portable terminal, which incorporates therein the high-frequency module according to claim 27.

* * * * *